United States Patent
Kawaguchi

(10) Patent No.: US 11,895,844 B2
(45) Date of Patent: Feb. 6, 2024

(54) SEMICONDUCTOR MEMORY DEVICE

(71) Applicant: Kioxia Corporation, Tokyo (JP)

(72) Inventor: Genki Kawaguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 316 days.

(21) Appl. No.: 17/199,888

(22) Filed: Mar. 12, 2021

(65) Prior Publication Data

US 2022/0052068 A1 Feb. 17, 2022

(30) Foreign Application Priority Data

Aug. 11, 2020 (JP) .................................. 2020-135770

(51) Int. Cl.
| | |
|---|---|
| *H10B 43/50* | (2023.01) |
| *H10B 43/35* | (2023.01) |
| *H10B 43/27* | (2023.01) |
| *H10B 43/10* | (2023.01) |
| *H01L 23/522* | (2006.01) |
| *G11C 16/04* | (2006.01) |

(52) U.S. Cl.
CPC ......... *H10B 43/50* (2023.02); *H01L 23/5226* (2013.01); *H10B 43/27* (2023.02); *H10B 43/35* (2023.02); *G11C 16/0483* (2013.01); *H10B 43/10* (2023.02)

(58) Field of Classification Search
CPC ........ H10B 43/50; H10B 43/27; H10B 43/35; H10B 43/10; H10B 43/20; H10B 41/20; H10B 41/27; H10B 41/30; H01L 23/5226; H01L 29/7926; H01L 21/28282; H01L 21/76816; H01L 21/76865; H01L 21/76877; H01L 21/76831
See application file for complete search history.

(56) References Cited

U.S. PATENT DOCUMENTS

| | | |
|---|---|---|
| 9,240,347 B2 | 1/2016 | Chandrashekar et al. |
| 9,418,934 B1 | 8/2016 | Briggs et al. |
| 9,793,293 B1 | 10/2017 | Horibe et al. |
| 10,090,319 B2 | 10/2018 | Fujiki et al. |

(Continued)

FOREIGN PATENT DOCUMENTS

| | | |
|---|---|---|
| JP | 62-42442 A | 2/1987 |
| JP | 2015-512568 A | 4/2015 |

(Continued)

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

A semiconductor memory device according to an embodiment includes a substrate including block areas, members, conductive layers, and pillars. Each of the members is respectively disposed at a boundary portion between the block areas. At least one member of the members includes first portions and a second portion. The first portions are arranged in a first direction. The second portion is disposed between any two adjacent ones of the first portions. Either one of one of the first portions and the second portion of the member is referred to as a third portion. The other one of the one of the first portions and the second portion of the member is referred to as a fourth portion. The third portion has a width in a second direction greater than a width of the fourth portion in the second direction.

15 Claims, 26 Drawing Sheets

(56) References Cited

U.S. PATENT DOCUMENTS

| | | | |
|---|---|---|---|
| 10,141,329 B2 | 11/2018 | Tsuda et al. | |
| 10,553,608 B2 | 2/2020 | Aoyama | |
| 10,985,176 B2* | 4/2021 | Iwai | H10B 41/41 |
| 2015/0137259 A1* | 5/2015 | Han | H01L 29/66833 |
| | | | 257/773 |
| 2015/0179567 A1* | 6/2015 | Govindaraju | H01L 23/53223 |
| | | | 257/758 |
| 2016/0126135 A1* | 5/2016 | Zhang | H01L 23/53266 |
| | | | 438/655 |
| 2016/0336338 A1* | 11/2016 | Song | H10B 43/27 |
| 2016/0343612 A1* | 11/2016 | Wang | H01L 21/76856 |
| 2017/0062470 A1* | 3/2017 | Han | H10B 43/10 |
| 2021/0288064 A1* | 9/2021 | Nishimura | H10B 41/27 |

FOREIGN PATENT DOCUMENTS

| | | |
|---|---|---|
| JP | 2016-92044 A | 5/2016 |
| JP | 2018-519656 A | 7/2018 |
| JP | 2019-149445 A | 9/2019 |

* cited by examiner

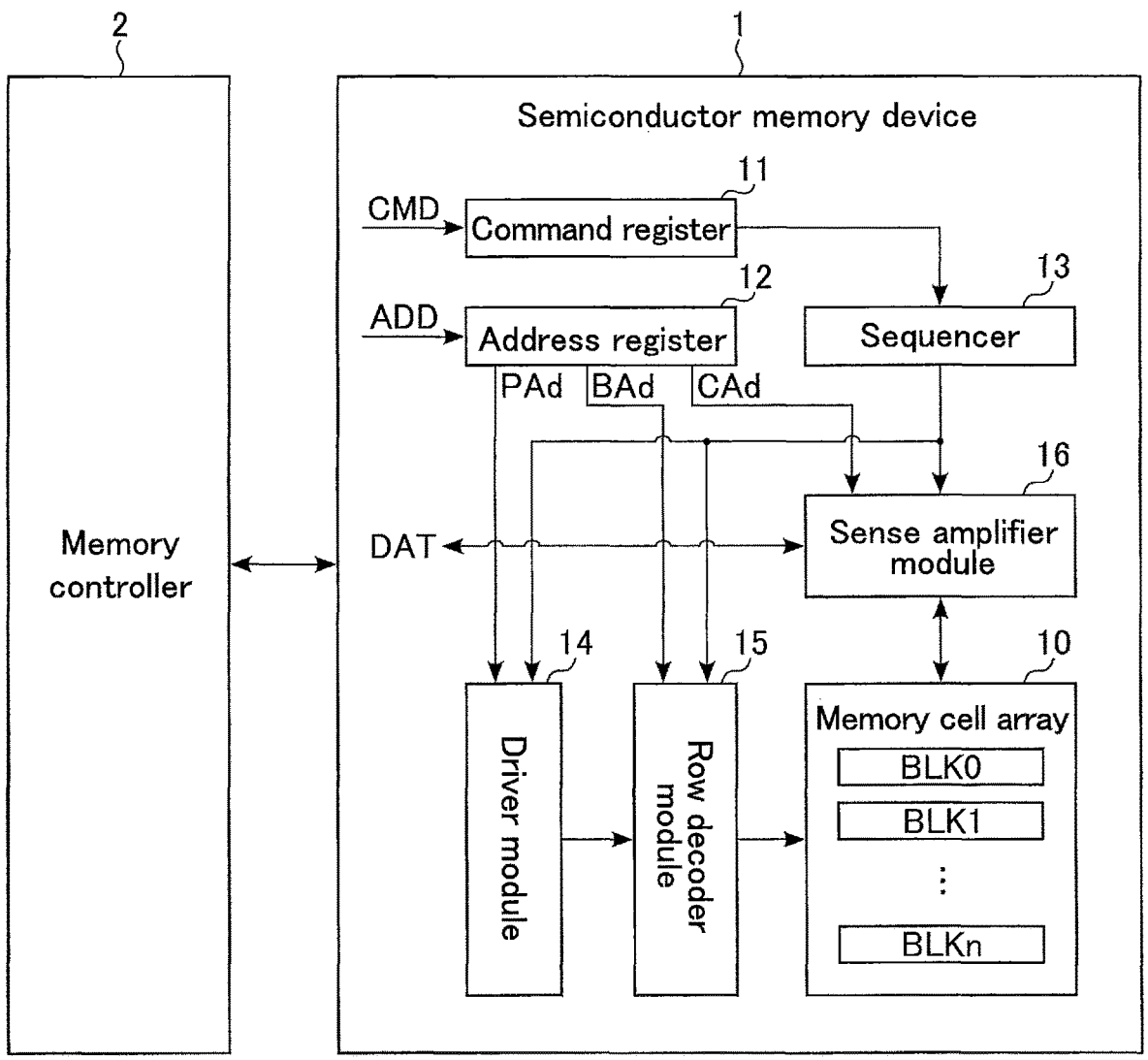
F I G. 1

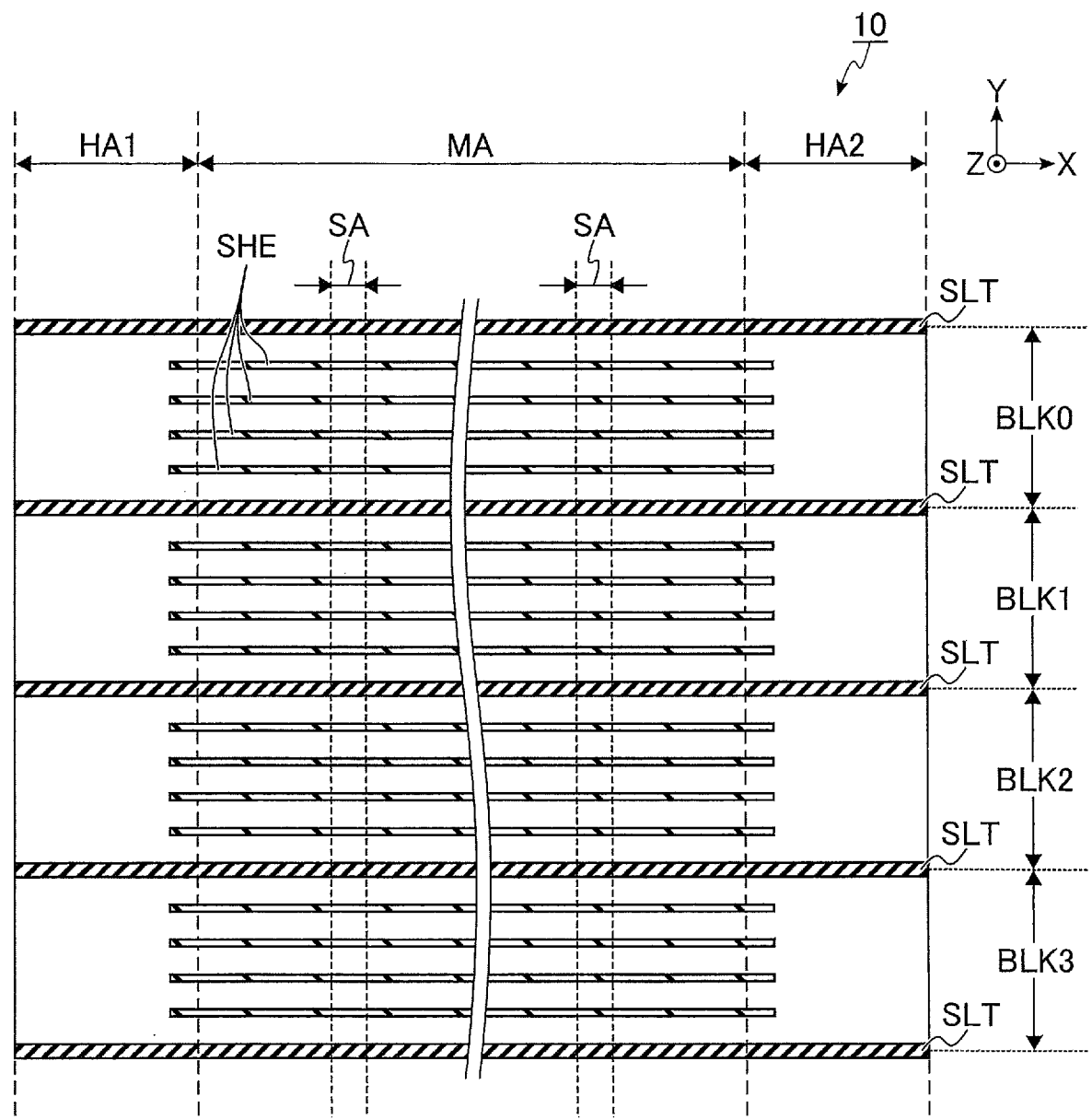
F I G. 3

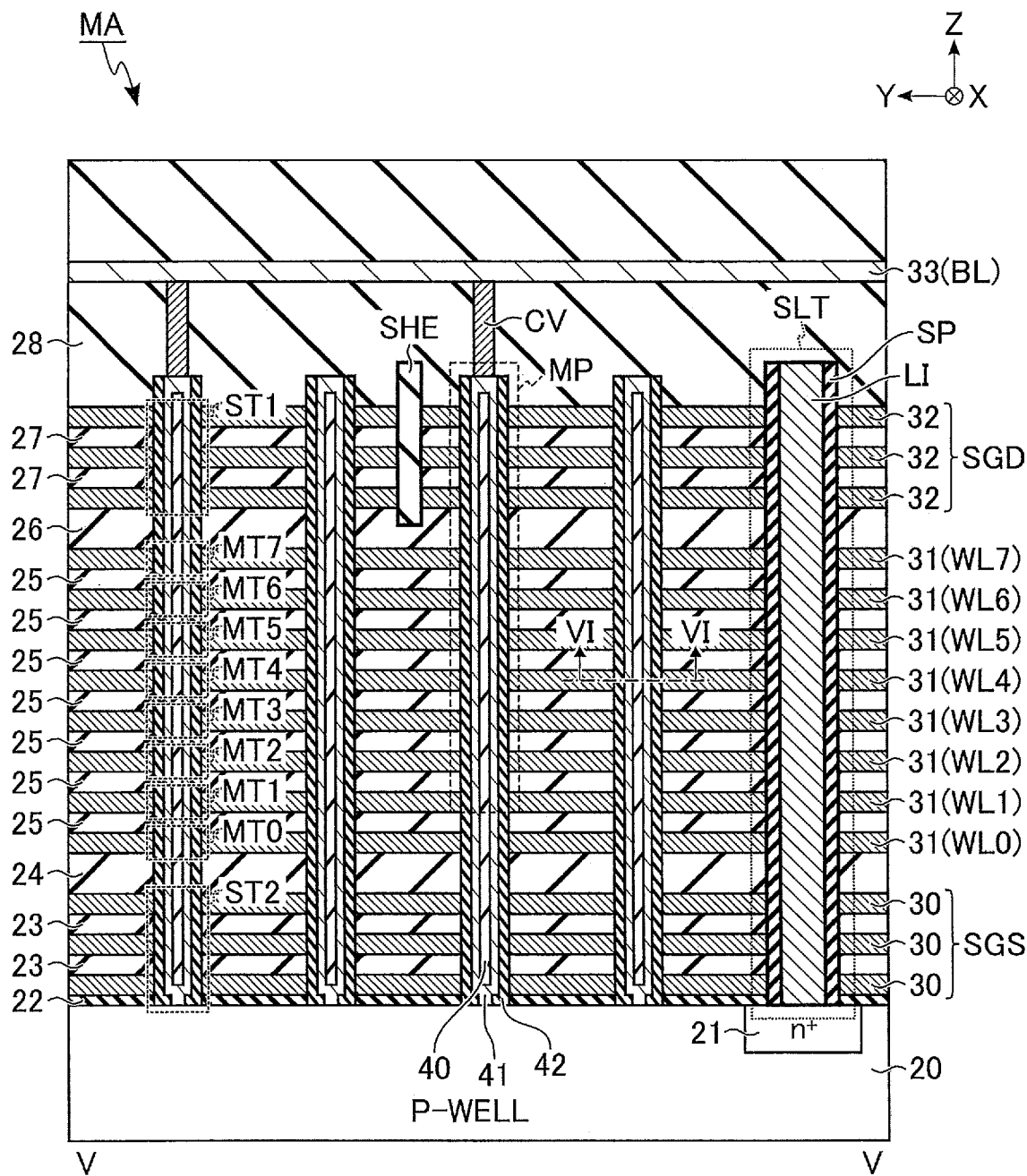
F I G. 5

(1) Stack sacrificial members SM (2) Perform replacement process (3) Fill slit SLT

| | Step S11 | Step S12 | Step S13 |
|---|---|---|---|
| Plan view including slit SLT | | | |
| Cross-sectional structure of normal portion NP (A-A' cross-section) | SLT, SP | Closure, 50, SP, Void | 50, Seam |
| Cross-sectional structure of wide portion WP (B-B' cross-section) | SLT, SP | Opening, 50, SP | Closure, 50, Void |

FIG. 13

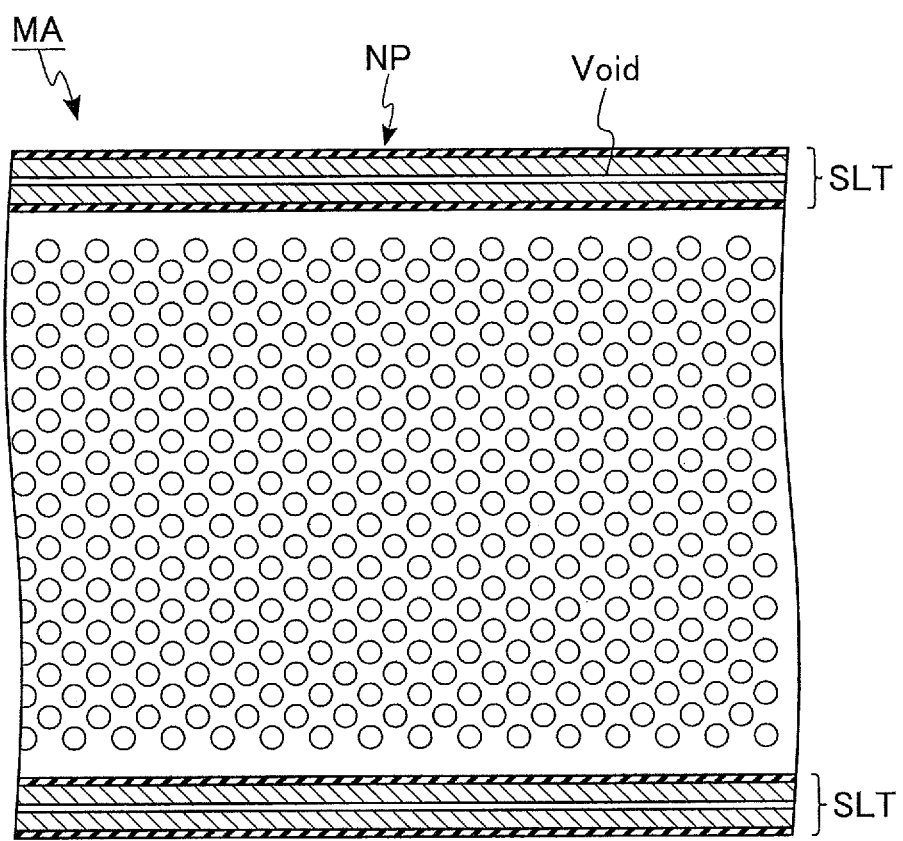
F I G. 14

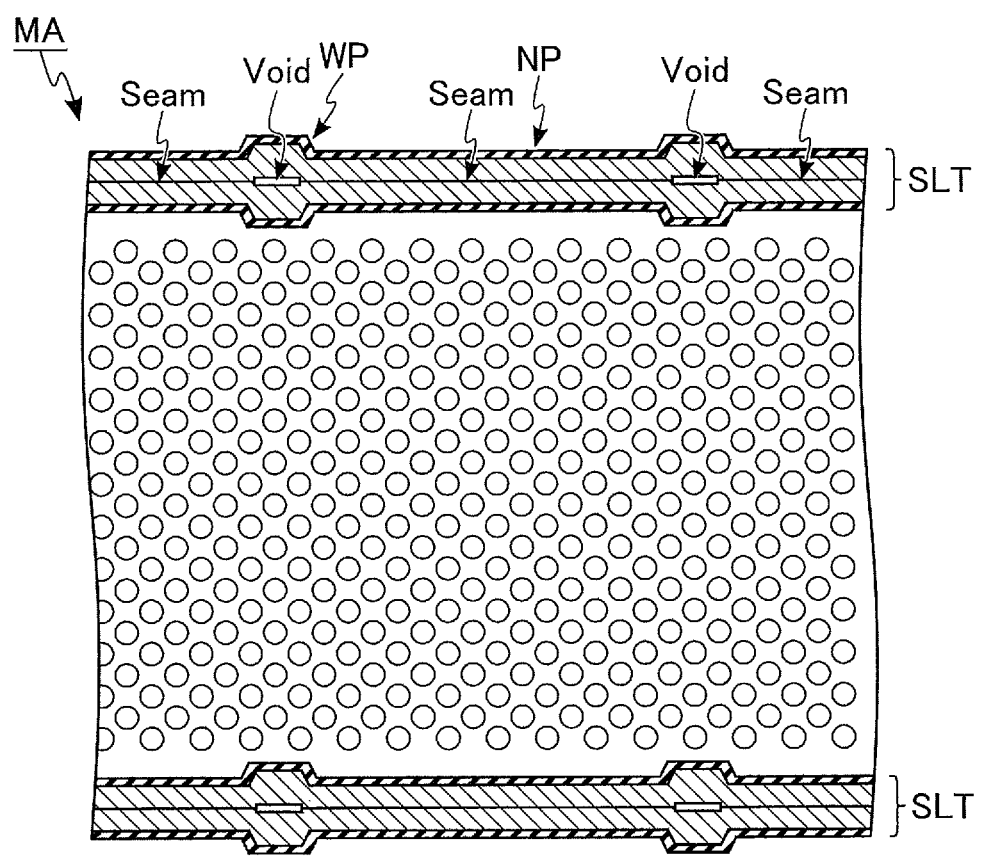
F I G. 15

|  | Step S21 | Step S22 | Step S23 |
|---|---|---|---|
| Plan view including slit SLT | | | |
| Cross-sectional structure of normal portion NP (A-A' cross-section) | SLT, SP | Opening | 50, Void |
| Cross-sectional structure of narrow portion TP (B-B' cross-section) | SLT, SP | Closure, 50, SP, Void | 50, Seam |

FIG. 19

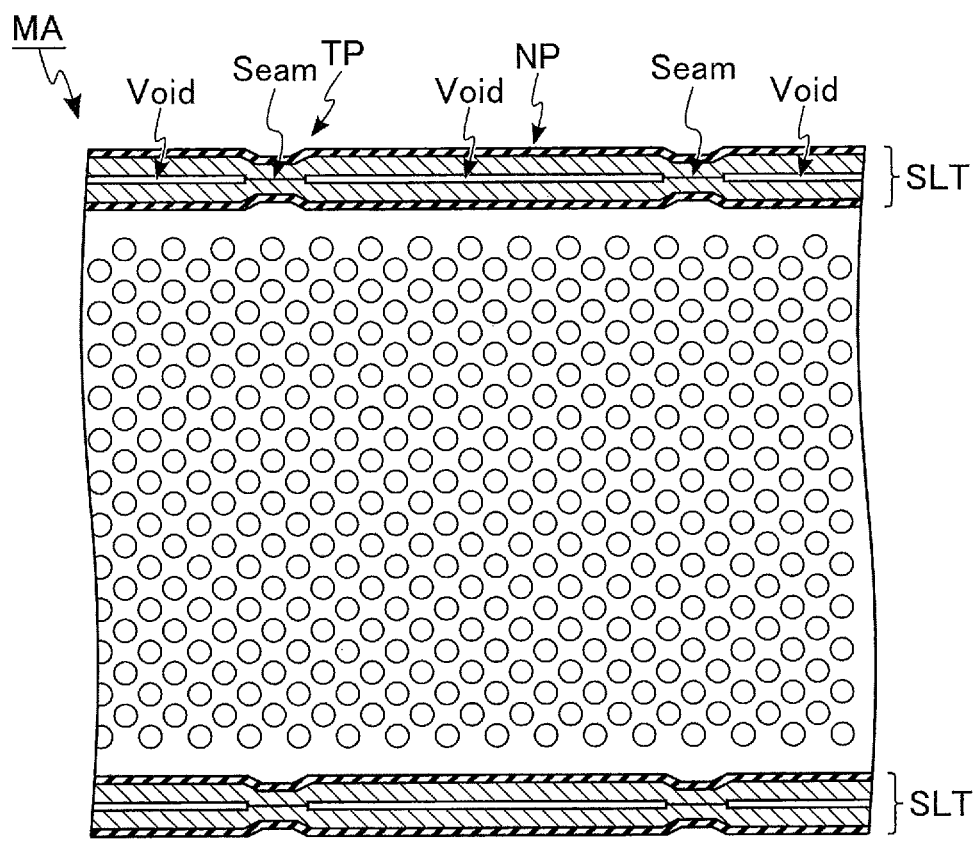
F I G. 20

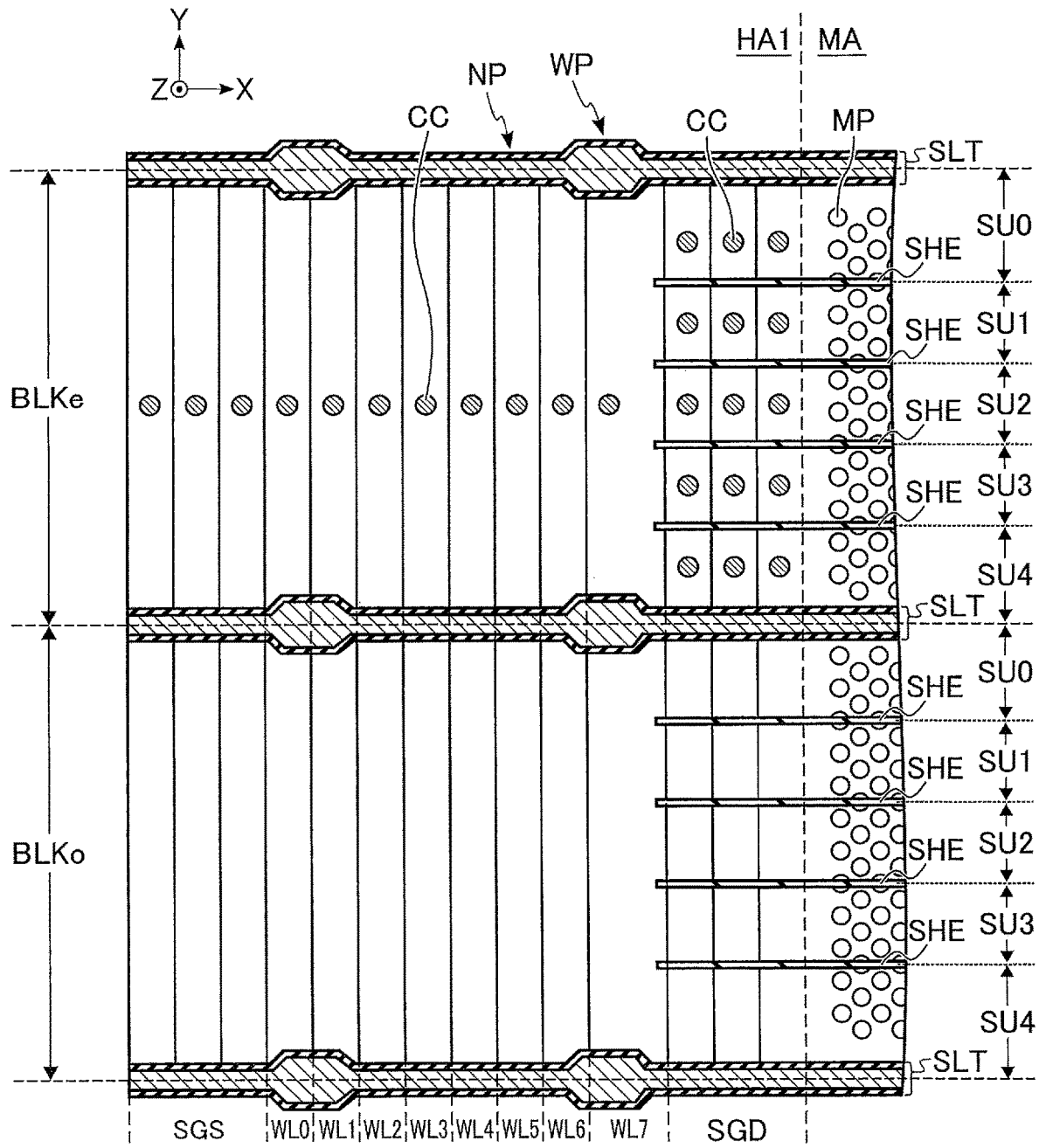
F I G. 21

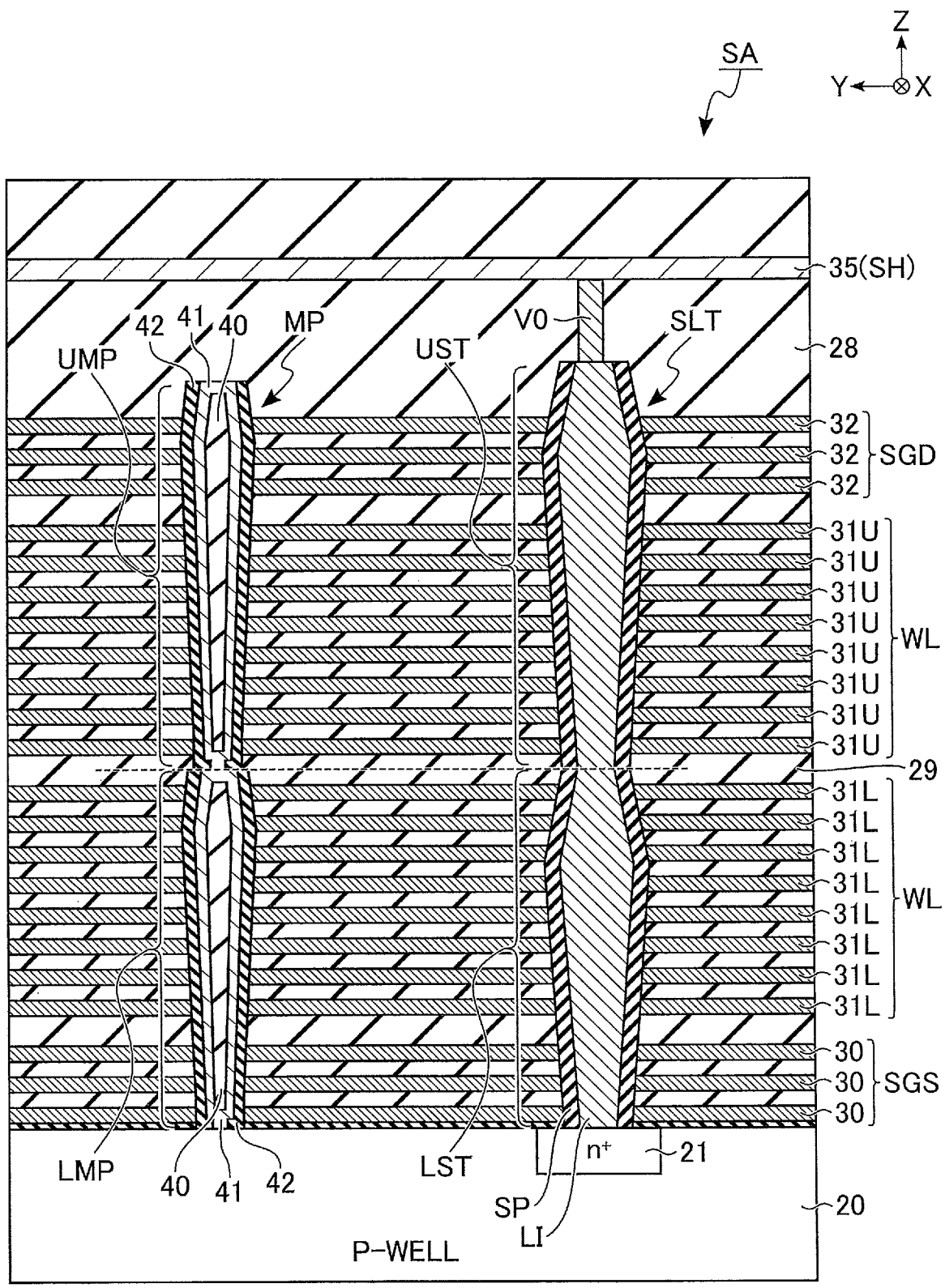
F I G. 22

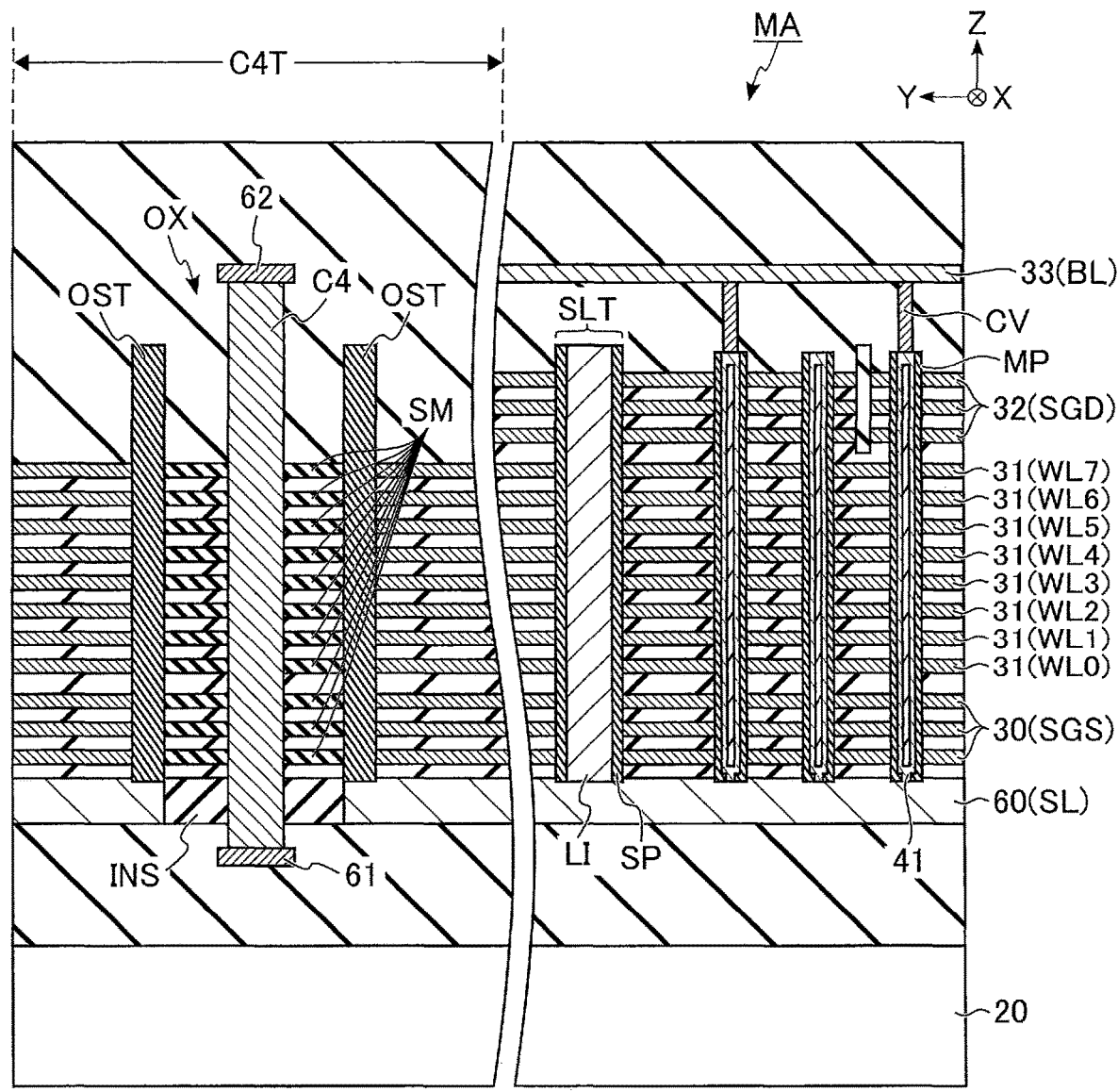
F I G. 24

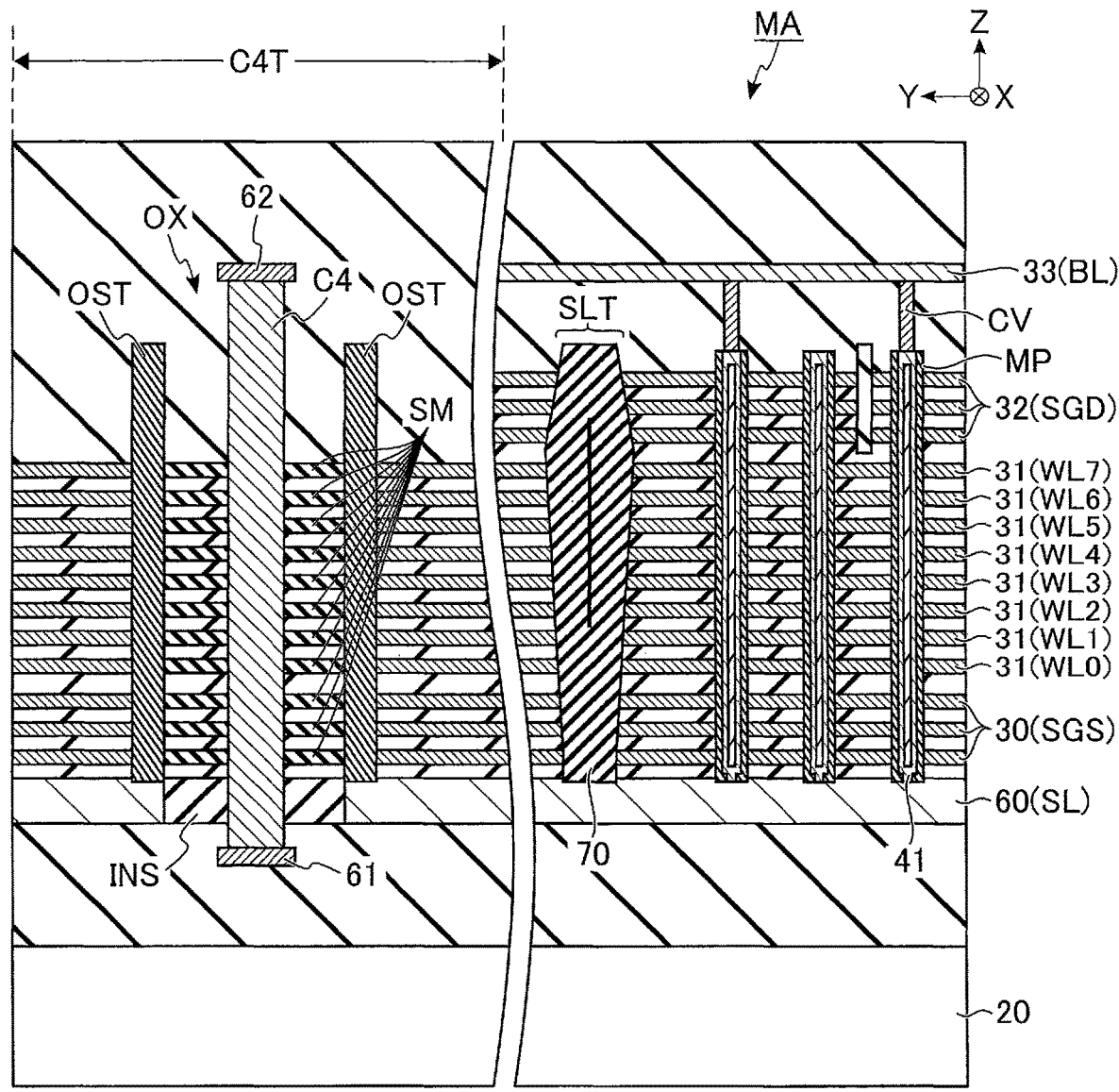
F I G. 25

SEMICONDUCTOR MEMORY DEVICE

CROSS-REFERENCE TO RELATED APPLICATIONS

This application is based upon and claims the benefit of priority from Japanese Patent Application No. 2020-135770, filed Aug. 11, 2020, the entire contents of which are incorporated herein by reference.

FIELD

Embodiments described herein relate generally to a semiconductor memory device.

BACKGROUND

A NAND-type flash memory capable of storing data in a nonvolatile manner has been known.

BRIEF DESCRIPTION OF THE DRAWINGS

FIG. 1 is a block diagram showing an example of an overall structure of a semiconductor memory device according to the present embodiment.

FIG. 3 is a plan view showing an exemplary planar layout of a memory cell array in the semiconductor memory device according to the embodiment.

FIG. 5 is a cross-sectional view showing an exemplary cross-sectional structure of the memory area in the memory cell array of the semiconductor memory device according to the embodiment, taken along V-V in FIG. 4.

FIG. 13 includes cross-sectional views indicating an exemplary flow of a slit filling process in the semiconductor memory device according to the embodiment.

FIG. 14 is a plan view showing an exemplary structure of slits in a comparative example of the embodiment.

FIG. 15 is a plan view showing an exemplary structure of slits according to the embodiment.

FIG. 19 includes cross-sectional views indicating an exemplary flow of a slit filling process in the semiconductor memory device according to the first modification example of the embodiment.

FIG. 20 is a plan view showing an exemplary structure of slits according to the first modification example of the embodiment.

FIG. 21 is a plan view showing an example of a detailed planar layout of a hookup area in a memory cell array of a semiconductor memory device according to a second modification example of the embodiment.

FIG. 22 is a cross-sectional view showing an exemplary cross-sectional structure of a memory area in a memory cell array of a semiconductor memory device according to a third modification example of the embodiment.

FIG. 24 is a cross-sectional view showing an exemplary cross-sectional structure of the through contact area in the memory cell array of the semiconductor memory device according to the fourth modification example of the embodiment.

FIG. 25 is a cross-sectional view showing an exemplary cross-sectional structure of a through contact area in a memory cell array of a semiconductor memory device according to a fifth modification example of the embodiment.

DETAILED DESCRIPTION

Figure 2:
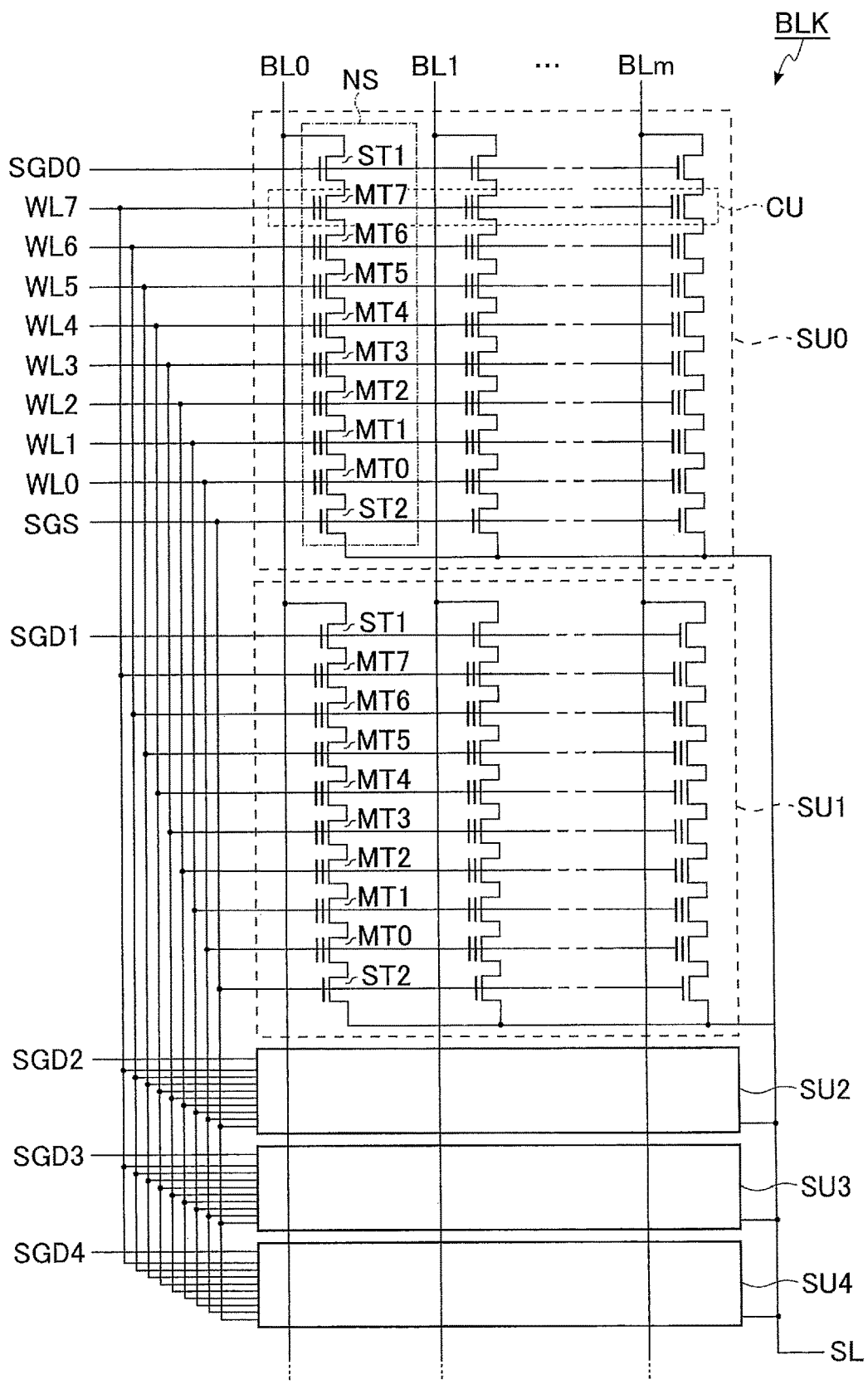
FIG. 2 is a circuit diagram showing an exemplary circuit structure of a memory cell array in the semiconductor memory device according to the embodiment.

A semiconductor memory device according to an embodiment includes a substrate, a plurality of members, a plurality of conductive layers, and a plurality of pillars. The substrate includes a plurality of block areas. Each of the block areas is provided to extend in a first direction. The block areas are arranged in a second direction that intersects the first direction. Each of the members is provided to extend in the first direction, and is respectively disposed at a boundary portion between the block areas. The conductive layers are partitioned by the members. The conductive layers are arranged in a third direction that intersects the first direction and the second direction, and are disposed separately from each other. The pillars are disposed in each of the block areas. Each of the pillars is provided to penetrate the conductive layers. A portion at which one of the pillars and one of the conductive layers intersect functions as a memory cell. At least one member of the members includes a plurality of first portions and a second portion. The first portions are arranged in the first direction. The second portion is disposed between any two adjacent ones of the first portions. Either one of one of the first portions and the second portion of the member is referred to as a third portion. The other one of the one of the first portions and the second portion of the member is referred to as a fourth portion. The third portion has a width in the second direction greater than a width of the fourth portion in the second direction. The third portion has a length in the first direction greater than the width of the fourth portion in the second direction. The first portions of the member have a same layer structure as the second portion.

The embodiments will be explained below by referring to the drawings. The embodiments exemplify a device and method that realize the technical concept of the invention. The drawings are provided merely for schematic or conceptual purposes, and thus may not be identical to the actual dimensions and proportions. Furthermore, the technical concept of the invention is not limited by the form, structure, arrangement or the like of the structural components.

In the following explanation, structural components having basically the same functions and structures will be referred to by the same reference symbols. The reference symbols may contain a character string and numerals attached to the character string. When reference symbols containing the same character string are referenced, the corresponding components have the same structure, and are distinguished from each other by the numerals attached to the character strings. When components having reference symbols containing the same character string need not be distinguished from each other, these components may be referred to by a reference symbol containing the character string only.

Embodiments

A semiconductor memory device 1 according to the embodiment will be described below.

[1] STRUCTURE OF SEMICONDUCTOR MEMORY DEVICE 1

[1-1] Overall Structure of Semiconductor Memory Device 1

FIG. 1 shows an exemplary structure of the semiconductor memory device 1 according to the embodiment. The semiconductor memory device 1 is a NAND flash memory configured to store data in a nonvolatile manner, and may be controlled by an external memory controller 2. As illustrated in FIG. 1, the semiconductor memory device 1 may include a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer greater than or equal to 1). A block BLK is a set of memory cells that can store data in a nonvolatile manner, and may be used as a data erase unit. The memory cell array 10 is provided with a plurality of bit lines and word lines. Each memory cell is associated with one bit line and one word line. The structure of the memory cell array 10 will be discussed later in detail.

The command register 11 holds a command CMD that the semiconductor memory device 1 receives from the memory controller 2. A command CMD may include an instruction to instruct the sequencer 13 to execute a read operation, write operation, erase operation and the like.

The address register 12 holds address information ADD that the semiconductor memory device 1 receives from the memory controller 2. The address information ADD may include a block address BAd, a page address PAd, and a column address CAd. For instance, the block address BAd, page address PAd, and column address CAd may be used for selection of a block BLK, a word line, and a bit line, respectively.

The sequencer 13 controls the overall operation of the semiconductor memory device 1. For instance, the sequencer 13 may control the driver module 14, row decoder module 15, and sense amplifier module 16, based on a command CMD held in the command register 11, to execute a read operation, write operation, and erase operation.

The driver module 14 generates a voltage to be used for the read operation, write operation, and erase operation. Then, the driver module 14 applies the generated voltage to a signal line corresponding to the selected word line, based for example on the page address PAd held in the address register 12.

The row decoder module 15 selects one of the blocks BLK in a memory cell array 10, based on the block address BAd held in the address register 12. Then, the row decoder module 15 transfers the voltage applied to the signal line corresponding to the selected word line, to this selected word line in the selected block BLK.

The sense amplifier module 16 applies, in a write operation, a desired voltage to each bit line in accordance with write data DAT received from the memory controller 2. In a read operation, the sense amplifier module 16 determines the data stored in a memory cell based on the voltage of the bit line, and transfers the determination result as read data DAT to the memory controller 2.

The above-mentioned semiconductor memory device 1 and memory controller 2 may be combined into a single semiconductor device. Examples of such semiconductor devices include a memory card such as an SD™ card, and a solid state drive (SSD).

[1-2] Circuit Structure of Memory Cell Array 10

FIG. 2 illustrates an exemplary circuit structure of the memory cell array 10 in the semiconductor memory device 1 according to the embodiment, showing one of the blocks BLK in the memory cell array 10. A block BLK may contain five string units SU0 to SU4, as illustrated in FIG. 2.

Each of the string units SU includes a plurality of NAND strings NS, each associated with one of bit lines BL0 to BLm (where m is an integer greater than or equal to 1). Each NAND string NS may include memory cell transistors MT0 to MT7 and select transistors ST1 and ST2. A memory cell transistor MT includes a control gate and a charge storage layer, and stores data in a nonvolatile manner. Each of the select transistors ST1 and ST2 is used for selection of a string unit SU in various operations.

In each of the NAND strings NS, memory cell transistors MT0 to MT7 are connected in series with each other. The drain of the select transistor ST1 is coupled to the associated bit line BL. The source of the select transistor ST1 is coupled to one end of the series-coupled memory cell transistors MT0 to MT7. The drain of the select transistor ST2 is coupled to the other end of the series-coupled memory cell transistors MT0 to MT7. The source of the select transistor ST2 is coupled to a source line SL.

Within a block BLK, the control gates of the memory cell transistors MT0 to MT7 are each coupled to the corresponding one of the word lines WL0 to WL7. Within a string unit SU0, the gates of the select transistors ST1 are coupled to a select gate line SGD0. Within a string unit SU1, the gates of the select transistors ST1 are coupled to a select gate line SGD1. Within a string unit SU2, the gates of the select transistors ST1 are coupled to a select gate line SGD2. Within a string unit SU3, the gates of the select transistors ST1 are coupled to a select gate line SGD3. Within a string unit SU4, the gates of the select transistors ST1 are coupled to a select gate line SGD4. The gates of the select transistors ST2 are coupled to a select gate line SGS.

Different column addresses are assigned to the bit lines BL0 to BLm. Each bit lines BL is shared by the NAND strings NS to which the same column address is assigned across a plurality of blocks ELK. A set of word lines WL0 to WL7 is provided for each block BLK, while a source line SL is shared by different blocks BLK.

A group of memory cell transistors MT commonly coupled to a word line WL in one string unit SU may be referred to as a cell unit CU. The storage capacity of a cell unit CU including memory cell transistors MT, which each store for example 1-bit data, is defined as "1-page data". The cell unit CU may have a storage capacity of 2-page data or more in accordance with the number of bits of the data stored in the memory cell transistors MT.

The circuit structure of the memory cell array 10 incorporated in the semiconductor memory device 1 according to the embodiment is not limited to the above. The number of string units SU in a block BLK and the numbers of memory cell transistors MT and select transistors ST1 and ST2 in a NAND string NS may be determined to be any number.

[1-3] Structure of Memory Cell Array 10

An exemplary structure of the memory cell array 10 in the semiconductor memory device 1 according to the embodiment will be described below. In the drawings mentioned below, the X direction corresponds to the direction the word lines WL extend, the Y direction corresponds to the direction the bit lines BL extend, and the Z direction corresponds to the direction vertical to the surface of a semiconductor substrate used for the formation of the semiconductor memory device 1. The plan views are provided with a hatch pattern as appropriate, to enhance the visibility. This hatch pattern, however, may not relate to the materials or properties of the hatch-lined structural components. To enhance the visibility of the drawing, some of the components may be omitted as appropriate from the cross-sectional view. The components illustrated in the drawings may be simplified as appropriate.

[1-3-1] Planar Layout of Memory Cell Array 10

FIG. 3 shows an exemplary planar layout of the memory cell array 10 of the semiconductor memory device 1 according to the embodiment, describing an area that corresponds to four blocks BLK0 to BLK3. As illustrated in FIG. 3, the planar layout of the memory cell array 10 may be divided in the X direction into a memory area MA and hookup areas HA1 and HA2. The memory cell array 10 includes slits SLT and SHE.

The memory area MA includes a plurality of NAND strings NS. The memory area MA also includes a plurality of shunt areas SA. A shunt area SA extends in the Y direction, and includes shunt wirings that are respectively used as part of a source line SL. A memory area MA is interposed between the hookup areas HA1 and HA2. Each of the hookup areas HA1 and HA2 is used for coupling stacked wirings (e.g., word lines WL and select gate lines SGD and SGS) to the row decoder module 15.

The slits SLT each include a portion extending in the X direction, and are arranged in the Y direction. Each slit SLT extends in the X direction across the memory area MA and hookup areas HA1 and HA2. Each slit SLT has a structure filled with an insulator or plate-like contact. The slit SLT partitions the wirings (e.g., word lines WL0 to WL7 and select gate lines SGD and SGS) that are arranged adjacent to each other with the slit SLT interposed between.

The slits SHE each include a portion extending in the X direction, and are arranged in the Y direction. In the illustrated example, four slits SHE are provided between every two adjacent slits SLT. Each slit SHE is provided to extend in the X direction across the memory area MA, with one end of the slit SHE included in the hookup area HA1, and the other end included in the hookup area HA2. Each slit SHE may have a structure filled with an insulator. The slit SHE partitions the wirings (at least the select gate line SGD) that are arranged adjacent to each other with the slit SHE interposed between.

In the above explained planar layout of the memory cell array 10, each one of the areas partitioned by the slits SLT corresponds to one block. BLK. Furthermore, each one of the areas partitioned by the slits SLT and SHE corresponds to one string unit SU. In the memory cell array 10, the layout of FIG. 3 may be repeated in the Y direction.

The planar layout of the memory cell array 10 in the semiconductor memory device 1 according to the embodiment is not limited to the above. For instance, the number of slits SHE arranged between every two adjacent slits SLT may be freely designed. The number of string units SU arranged between every two adjacent slits SLT may be changed in accordance with the number of slits SHE arranged between the adjacent slits SLT.

[1-3-2] Structure of Memory Area MA of Memory Cell Array 10

(Planar Layout of Memory Area MA of Memory Cell Array 10)

Figure 4:
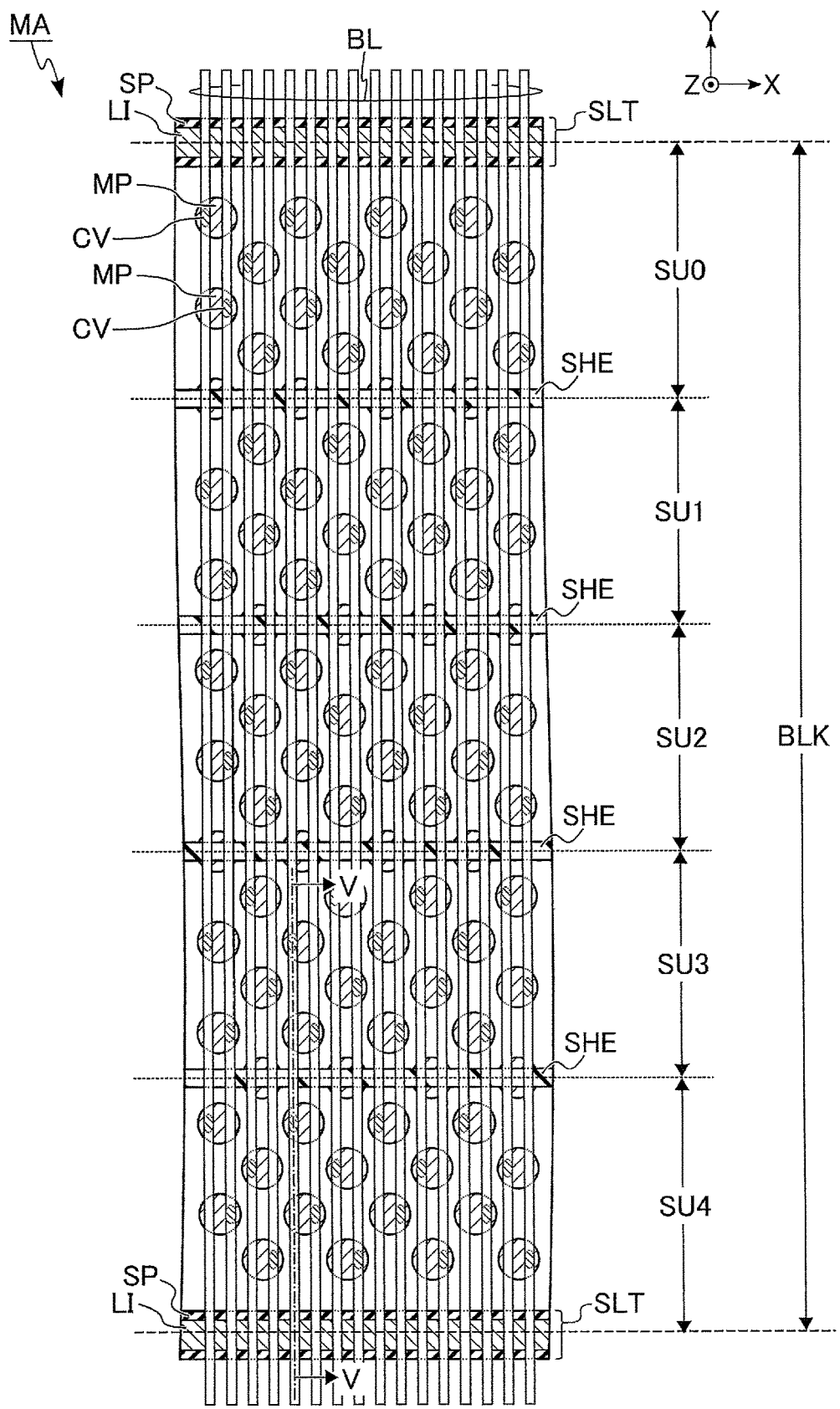
FIG. 4 is a plan view showing an example of a detailed planar layout of a memory area in the memory cell array of the semiconductor memory device according to the embodiment.

FIG. 4 shows an example of a detailed planar layout of a memory area MA in the memory cell array 10 of the semiconductor memory device 1 according to the embodiment, where an area including a block BLK (i.e., string units SU0 to SU4) is illustrated. As illustrated in FIG. 4, the memory area MA of the memory cell array 10 includes a plurality of memory pillars MP, a plurality of contacts CV, and a plurality of bit lines BL. Each slit SLT includes a contact LI and spacers SP.

Each of the memory pillars MP may function as a NAND string NS. The memory pillars MP are staggered, for example, in 24 rows between two adjacent slits SLT. A slit SHE extends across the memory pillars MP, for example in each of the fifth, tenth, fifteenth and twentieth rows from the top side of the drawing sheet.

The bit lines BL each include a portion extending in the Y direction, and are arranged in the X direction. Each bit line BL is arranged so as to overlap at least one of the memory pillars MP in each string unit SU. In this example, two bit lines BL are arranged to overlap one memory pillar MP. One of the bit lines BL that overlap the memory pillar MP is electrically coupled to this memory pillar MP by way of a contact CV.

When a memory pillar MP is in contact with a slit SHE, contact CV between the memory pillar MP and the bit line BL is omitted. In other words, a contact CV between a memory pillar MP contacting two different select gate lines SGD and the bit line BL is omitted. The numbers and arrangement of memory pillars MP, slits SHE and the like between any adjacent slits SLT are not limited to the structure explained with reference to FIG. 4, and may be modified as needed. The number of bit lines BL overlapping a memory pillar MP can be freely designed.

The contact LI is a conductor having a portion extending in the X direction. The spacer SP is an insulator provided on the side surface of a contact LI. That is, the contact LI is held between spacers SP. A contact LI is isolated and insulated by a spacer SP from the conductor (e.g., word lines WL0 to WL7 and select gate lines SGD and SGS) adjacent to this contact LI in the Y direction.

(Cross-Sectional Structure of Memory Area MA of Memory Cell Array 10)

FIG. 5 shows a cross-sectional view of an exemplary cross-sectional structure of the memory area MA in the memory cell array 10 of the semiconductor memory device 1 according to the embodiment, taken along V-V in FIG. 4. As illustrated in FIG. 5, the memory cell array 10 further includes a P-type well region 20, insulating layers 22 to 28, and conductive layers 30 to 33.

The P-type well region 20 is disposed in the vicinity of the surface of the semiconductor substrate and contains a P-type impurity (e.g., boron). The P-type well region 20 includes an N-type semiconductor region 21. The N-type semiconductor region 21 is arranged in the vicinity of the surface of the P-type well region 20 to serve as an N-type impurity diffusion region. The N-type semiconductor region 21 may be doped with phosphorus.

An insulating layer 22 is provided on the P-type well region 20. The conductive layers 30 and insulating layers 23 are alternately stacked on the insulating layer 22. A conductive layer 30 may be formed into a plate shape expanding along the XY plane. The stacked conductive layers 30 are used as a select gate line SGS. The conductive layers 30 may contain tungsten.

An insulating layer 24 is provided on the uppermost conductive layer 30. The conductive layers 31 and insulating layers 25 are alternately stacked on the insulating layer 24. A conductive layer 31 may be formed into a plate shape expanding along the XY plane. The stacked conductive layers 31 are used as word lines WL0 to WL7, in ascending order from the side of the P-type well region 20. The conductive layers 31 may contain tungsten.

An insulating layer 26 is provided on the uppermost conductive layer 31. The conductive layers 32 and insulating layers 27 are alternately stacked on the insulating layer 26. A conductive layer 32 may be formed into a plate shape expanding along the XY plane. The stacked conductive layers 32 are used as a select gate line SGD. The conductive layers 32 may contain tungsten.

An insulating layer 28 is provided on the uppermost conductive layer 32. A conductive layer 33 is provided on the insulating layer 28. The conductive layer 33 may be formed into a line extending in the Y direction, and is used as a bit line BL. That is, a plurality of conductive layers 33 are arranged along the X direction in an area that is not shown in the drawing The conductive layers 33 may contain copper.

Each of the memory pillars MP extends in the Z direction, penetrating the insulating layer 22 to 27 and conductive layers 30 to 32. The bottom of the memory pillar MP is in contact with the P-type well region 20. The intersecting portion of the memory pillar MP and the conductive layers 30 functions as a select transistor ST2. The intersecting portion of the memory pillar MP and each of the conductive layers 31 functions as a memory cell transistor MT. The intersecting portion of the memory pillar MP and the conductive layers 32 functions as a select transistor ST1.

Each memory pillar MP includes a core member 40, a semiconductor layer 41, and a stacked film 42. The core member 40 is provided to extend along the Z direction. For instance, the top end of the core member 40 is included in a layer above the uppermost conductive layer 32, while the bottom end of the core member 40 is included in a layer above the P-type well region 20. The semiconductor layer 41 surrounds the core member 40, and part of the semiconductor layer 41 is in contact with the P-type well region 20 at the bottom of the memory pillars MP. The stacked film 42 covers the side and bottom surfaces of the semiconductor layer 41, except for the portion where the semiconductor layer 41 is in contact with the P-type well region 20. The core member 40 may contain an insulator such as silicon oxide, whereas the semiconductor layer 41 may contain silicon.

A pillar-shaped contact CV is provided on the top surface of the semiconductor layer 41 in a memory pillar MP. Of the four illustrated memory pillars MP, two memory pillars MP are illustrated as having a contact CV. In the memory area MA, the memory pillars MP that do not overlap the slit SHE and are illustrated in FIG. 5 as having no contact CV coupled thereto are coupled to a contact CV in a different region that is not illustrated in this drawing.

A conductive layer 33, or in other words a bit line BL, is provided in contact with the top surface of the contact CV. One contact CV is coupled to the conductive layer 33 in each space partitioned by the slits SLT and SHE. That is, memory pillars MP arranged between adjacent slits SLT and SHE and memory pillars MP arranged between any two adjacent slits SHE are electrically coupled to each conductive layer 33.

The slit SLT includes a portion expanding in the XZ plane to divide each of the conductive layers 30 to 32. The contact LI in the slit SLT extends along the slit SLT. Part of the top end of the contact LI is in contact with the insulating layer 28. The bottom end of the contact LI is in contact with the N-type semiconductor region 21. The spacer SP is provided at least between the contact LI and the conductive layers 30 to 32. The contact LI is isolated and insulated from the conductive layers 30 to 32 by the spacer SP.

The slit SHE includes a portion expanding in the XZ plane to divide at least each of the conductive layers 32. The top end of the slit SHE is in contact with the insulating layer 28. The bottom end of the slit SHE is in contact with the insulating layer 26. The slit SHE may contain an insulator such as silicon oxide. The top end of the slit SHE may be designed to be aligned with, or unaligned with, the top end of the slit SLT. Furthermore, the top end of the slit SHE may be designed to be aligned with, or unaligned with, the top end of the memory pillars MP.

Figure 6:
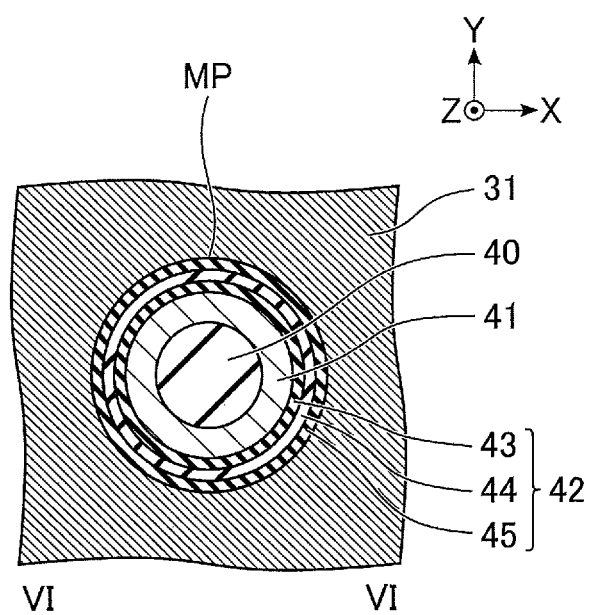
FIG. 6 is a cross-sectional view showing an exemplary cross-sectional structure of a memory pillar in the semiconductor memory device according to the embodiment, taken along VI-VI in FIG. 5.

FIG. 6 shows an exemplary cross-sectional structure of a memory pillar MP in the semiconductor memory device 1 according to the embodiment, taken along VT-VT in FIG. 5. In particular, a cross-sectional structure of a memory pillar MP taken along a plane parallel to the surface of the P-type well region 20 and including a conductive layer 31 is illustrated. As illustrated in FIG. 6, the stacked film 42 may include a tunnel insulating film 43, an insulating film 44, and a block insulating film 45.

In the cross section including a conductive layer 31, the core member 40 is provided in the middle of the memory pillar MP. The semiconductor layer 41 surrounds the peripheral surface of the core member 40. The tunnel insulating film 43 surrounds the peripheral surface of the semiconductor layer 41. The insulating film 44 surrounds the peripheral surface of the tunnel insulating film 43. The block insulating film 45 surrounds the peripheral surface of the insulating film 44. The conductive layer 31 surrounds the peripheral surface of the block insulating film 45.

The semiconductor layer 41 is used as a channel (current path) for the memory cell transistors MT0 to MT7 and select transistors ST1 and ST2. The tunnel insulating film 43 and block insulating film 45 may contain silicon oxide. The insulating film 44 is used as a charge storage layer for the memory cell transistors MT, and may contain silicon nitride. In this manner, each of the memory pillars MP functions as a NAND string NS.

The semiconductor memory device 1 according to the embodiment can create a current path between the semiconductor layer 41 of the memory pillar MP and the contact LI in the vicinity of the surface of the P-type well region 20 and N-type semiconductor region 21 when applying a voltage to the lowermost conductive layer 30. As a result, the semiconductor memory device 1 can pass a current between the bit line BL and the contact LI through a memory pillar MP. That is, the contact LI in the slit SLT can be used as part of a source line SL.

[1-3-3] Structure of Hookup Area HA of Memory Cell Array 10
(Planar Layout of Hookup Area HA of Memory Cell Array 10)

Figure 7:
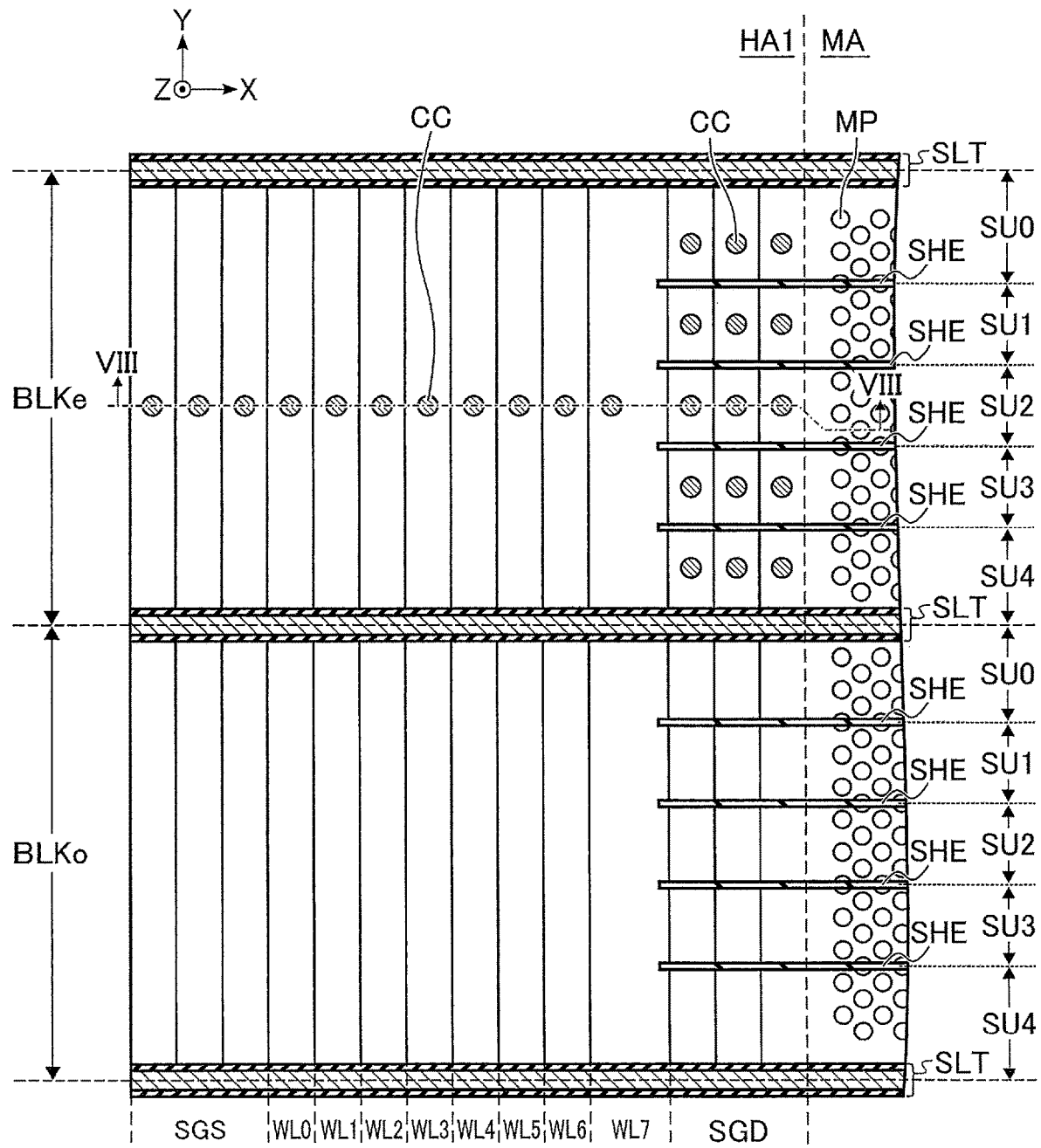
FIG. 7 is a plan view showing an example of a detailed planar layout of a hookup area in the memory cell array of the semiconductor memory device according to the embodiment.

FIG. 7 shows an example of a detailed planar layout of a hookup area HA1 in the memory cell array 10 of the semiconductor memory device 1 according to the embodiment, focusing on a region corresponding to adjacent blocks BLKe and BLKo. "BLKe" corresponds to an even-numbered block BLK, whereas "BLKo" corresponds to an odd-numbered block BLK. FIG. 7 also shows part of a memory area MA close to the hookup area HA1.

In the semiconductor memory device 1 according to the embodiment, the hookup area HA1 in the memory cell array 10 has a structure similar to that of the hookup area HA2 in the memory cell array 10. In the following description, the structures of the hookup areas HA1 and HA2 of the memory cell array 10 will be explained based on the structure of the hookup area HA1 of the memory cell array 10.

As illustrated in FIG. 7, each of the select gate line SGS, word lines WL0 to WL7, and select gate line SGD has a portion (terraced portion) that is not covered by the upper interconnect layers (conductive layers) in the hookup area HA1. This example includes a plurality of terraced portions for the select gate line SGS and for the select gate line SGD. The memory cell array 10 in the hookup area HA1 includes a plurality of contacts CC.

The portions that are not covered by the upper interconnect layers in the hookup area HA1 resemble steps, a terrace, or rimstone. In particular, steps are created between the select gate line SGS and word line WL0, between the word lines WL0 and WL1, . . . , between the word lines WL6 and WL7, and between the word lines WL7 and select gate line SGD. In the illustrated example, the stepped structure having steps in the X direction is formed by the end portion of the select gate line SGS, the end portions of the word lines WL0 to WL7, and the end portion of the select gate line SGD.

In the region where the hookup area HA1 overlaps the block BLKe, a plurality of contacts CC are respectively provided in the terraced portions of the select gate line SGS, word lines WL0 to WL7, and select gate lines SGD0 to SGD4. In the illustrated example, a plurality of contacts CC are provided on the terraced portions of the select gate line SGS and on the terraced portions of the select gate line SGD. In a region where the hookup area HA1 overlaps the block BLKo, contacts CC are omitted with respect to the stacked wirings.

On the other hand, in a region where the hookup area HA2 overlaps the block BLKo, though it is not shown in the drawing, a plurality of contacts CC are provided on the terraced portions of the select gate line SGS, word lines WL0 to WL7, and select gate lines SGD0 to SGD4. In a region where the hookup area HA2 overlaps the block BLKe, contacts CC are omitted with respect to the stacked wirings. That is, the planar layout of the block BLKo in the hookup area HA2 is the same as the layout of the block BLKe in the hookup area HA1 that is flipped in the X direction and Y direction, while the planar layout of the block BLKe in the hookup area HA2 is the same as the layout of the block BLKo in the hookup area HA1 that is flipped in the X direction and Y direction.

Each of the select gate line SGS, word lines WL0 to WL7, and select gate lines SGD0 to SGD4 is electrically coupled to the row decoder module 15 byway of a corresponding contact CC. In other words, a voltage can be applied from the contacts CC provided in at least one of the hookup areas HA1 and HA2, to each of the select gate line SGS, word lines WL0 to WL7, and select gate lines SGD0 to SGD4. A contact CC may be coupled to each of the hookup area HA1 and hookup area HA2 in each interconnect layer. If this is the case, a voltage is applied to the word line WL from both the contact CC of the hookup area HA1 and the contact CC of the hookup area HA2.

(Cross-Sectional Structure of Hookup Areas HA in Memory Cell Array 10)

Figure 8:
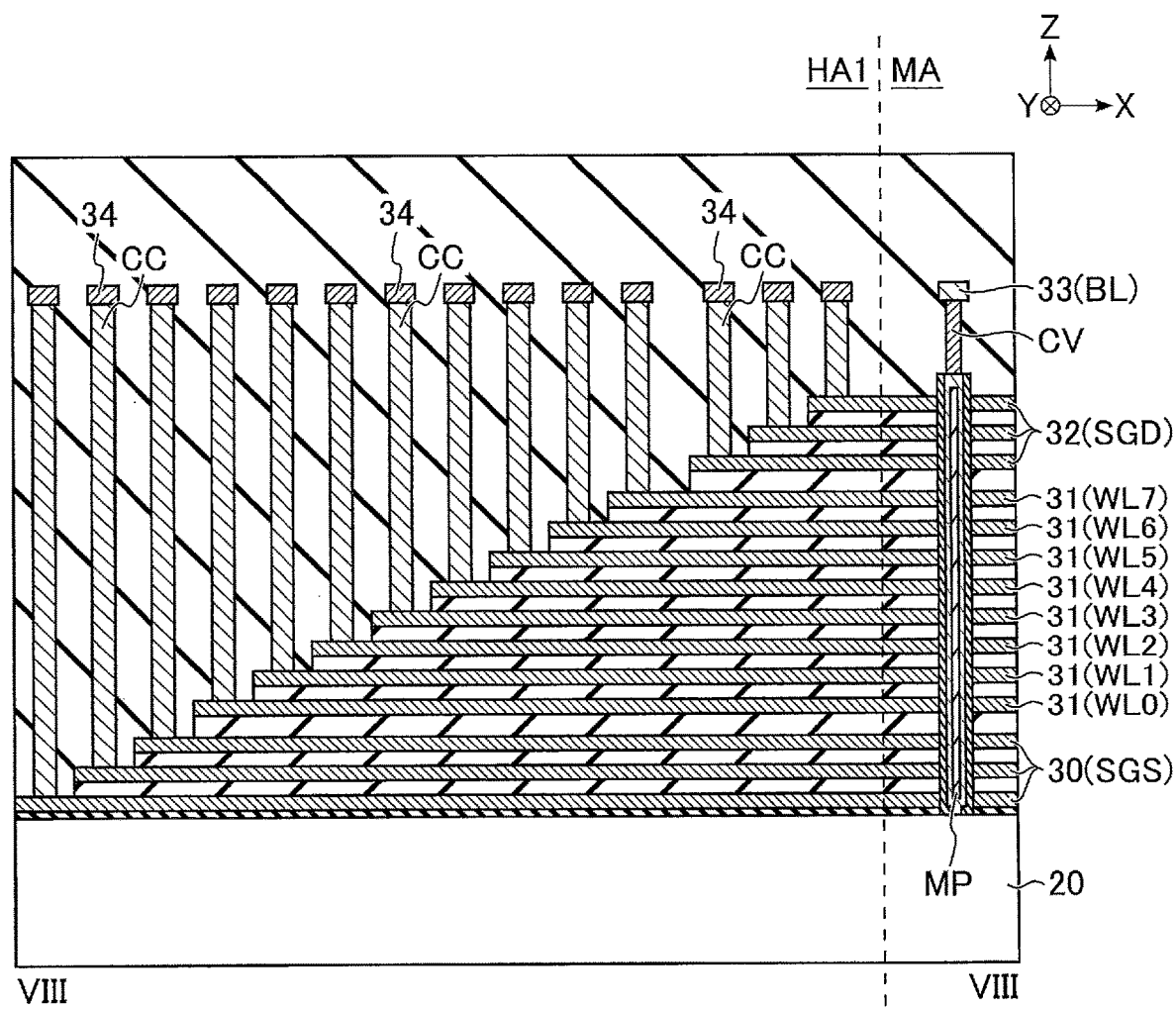
FIG. 8 is a cross-sectional view showing an exemplary cross-sectional structure of the hookup area in the memory cell array of the semiconductor memory device according to the embodiment, taken along VIII-VIII in FIG. 7.

FIG. 8 shows an exemplary cross-sectional structure of the hookup area HA1 in the memory cell array 10 of the semiconductor memory device 1 according to the embodiment, taken along VIII-VIII in FIG. 7. As illustrated in FIG. 8, the memory cell array 10 of the hookup area HA1 further includes a plurality of conductive layers 34. The end portions of the conductive layers 30 corresponding to the select gate line SGS, the end portions of the conductive layers 31 corresponding to the word lines WL, and the end portions of the conductive layers 33 corresponding to the select gate line SGD are formed into a staircase.

The contacts CC are provided in the terraced portions of the select gate line SGS, word lines WL0 to WL7, and select gate line SGD. A conductive layer 34 is provided on each contact CC. Each of the conductive layers 34 is electrically coupled to the row decoder module 15, and the conductive layers 34 are included in the same layer as the conductive layer 33. In this manner, the conductive layers 30, 31 and 32, respectively, are electrically coupled to the row decoder module 15 by way of the contacts CC and conductive layers 34.

The structure of the memory cell array 10 in the hookup area HA is not limited to the above. For instance, the conductive layers 32 corresponding to the select gate line SGD may include at least one terraced portion. When the end portions of multiple conductive layers 32 overlap each other, a contact may be formed to penetrate the end portions of these conductive layers 32. The conductive layers 32 thereby can be short-circuited so that they can serve as a single select gate line SGD.

[1-3-4] Structure of Shunt Area SA of Memory Cell Array 10
(Planar Layout of Shunt Area SA of Memory Cell Array 10)

Figure 9:
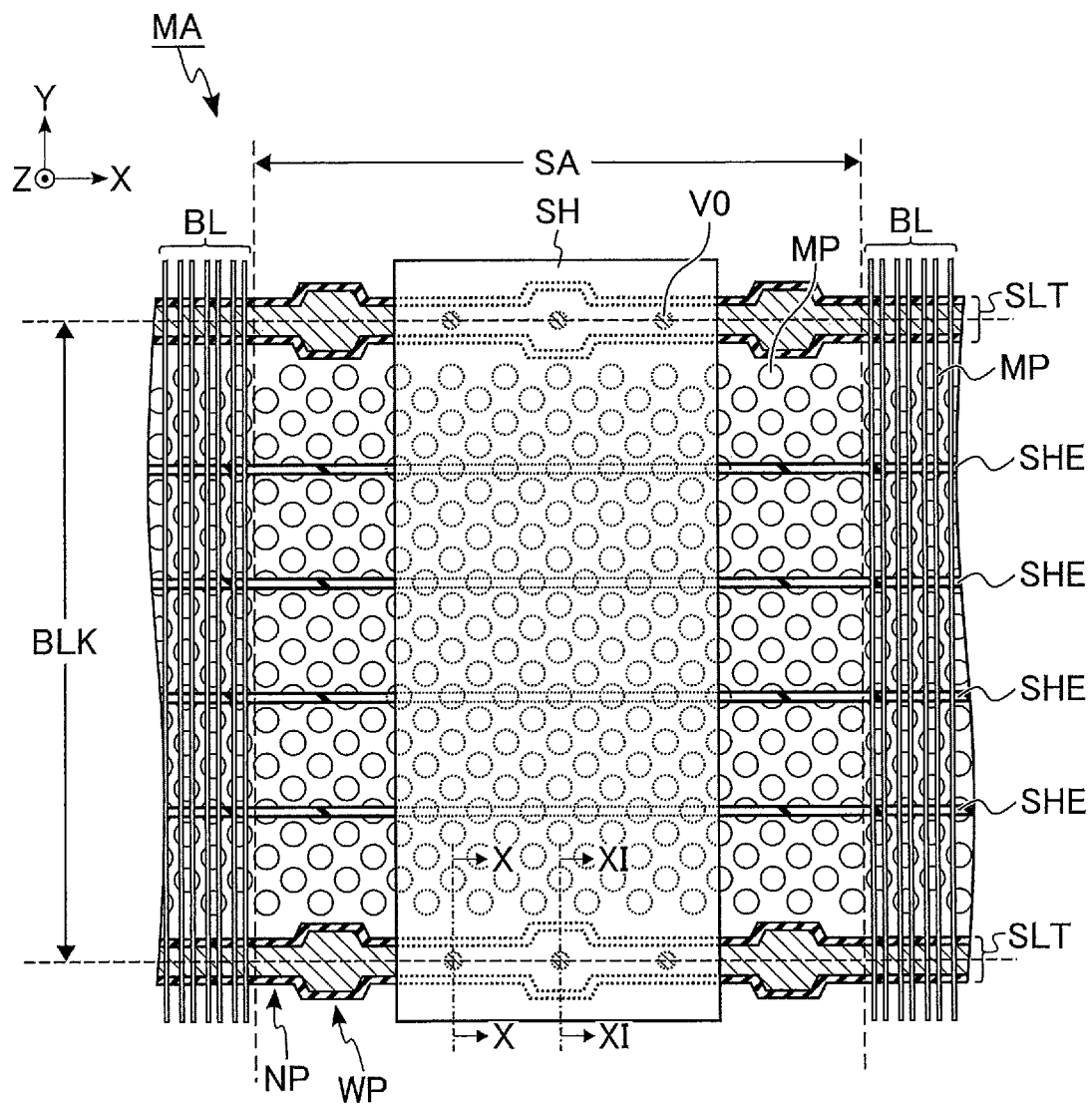
FIG. 9 is a plan view showing an example of a detailed planar layout of a shunt area in the memory cell array of the semiconductor memory device according to the embodiment.

FIG. 9 shows an example of a detailed planar layout of a shunt area SA in the memory cell array 10 of the semiconductor memory device 1 according to the embodiment, focusing on an area including a block BLK. FIG. 9 also shows part of the memory area MA close to the shunt area SA. As illustrated in FIG. 9, the memory cell array 10 in a shunt area SA includes a shunt line SH, a plurality of contacts V0, and a plurality of memory pillars MP.

The shunt line SH includes a portion extending in the Y direction. The shunt line SH has a width greater than that of the bit line BL. The shunt line SH intersects a plurality of slits SLT. Three contacts VO, for example, may be provided between a contact LI of each slit SLT and the shunt line SH. The contact LI of each slit SLT and the shunt line SH are electrically coupled to each other by way of three contacts V0. In this manner, the shunt line SH short-circuits the contact LI of each slit SLT. That is, the shunt line SH is used as part of a source line SL.

The memory pillars MP may be staggered in 24 rows in the same manner as for the layout of the memory area MA of FIG. 4. In the shunt area SA, contacts CV for the memory pillars MP may be omitted. The memory pillars MP in the shunt area SA are designed so as to not be coupled at least to the shunt line SH. A different arrangement pattern may be adopted for the memory pillars MP in the shunt area SA as long as the geometries of the memory pillars MP for data storage can be ensured.

In the shunt area SA, each slit SLT includes at least one wide portion WP. In this example, each slit SLT includes three wide portions WP separately arranged in the shunt area SA. The portions of the slit SLT arranged between the separate wide portions WP of the shunt area SA and arranged outside the shunt area SA will be referred to as normal portions NP. In the shunt area SA and outside the shunt area SA, a plurality of normal portions NP are arranged in the X direction to be adjacent to a wide portion WP. A wide portion WP of the slit SLT has a greater width in the Y direction than the width of a normal portion NP of the slit SLT in the Y direction. A normal portion NP of the slit SLT has a greater length in the X direction than the length of a wide portion WP of the slit SLT in the X direction. A wide portion WP of the slit SLT has a greater length in the X direction than the width of a normal portion NP of the slit SLT in the Y direction.

If a wide portion WP of the slit SLT is arranged in the region of the memory pillars MP used for storage of data, the slit SLT may be in contact with the memory pillars MP. It is therefore preferable that the slit SLT be designed to have a normal portion NP adjacent to the region where memory pillars MP for data storage are arranged. Furthermore, the wide portion WP of the slit SLT may be provided at least in one shunt area SA. The arrangement of wide portions WP may differ depending on different slits SLT.

(Cross-Sectional structure of Shunt Area SA of Memory Cell Array 10)

Figure 10:
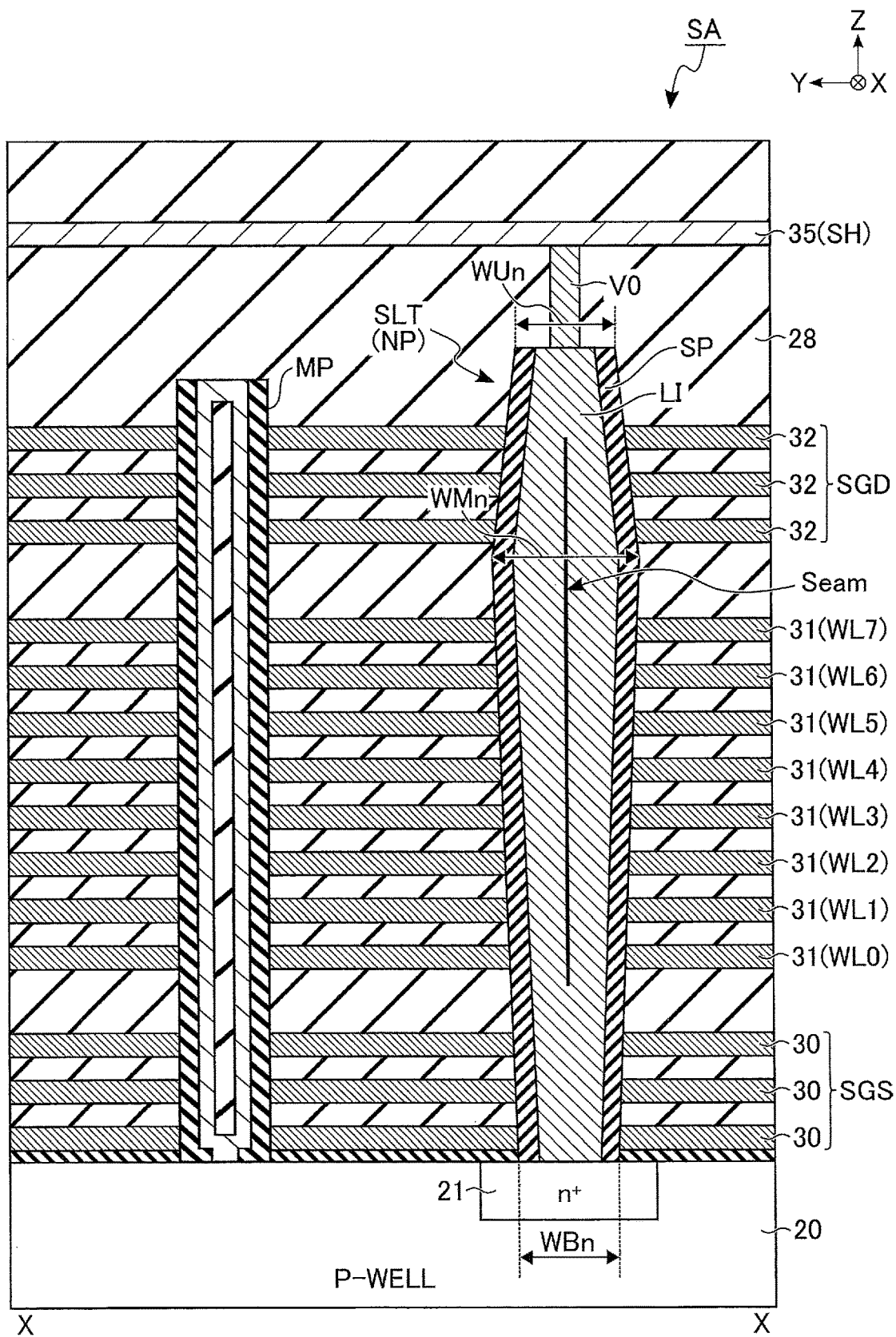
FIG. 10 is a cross-sectional view showing an exemplary cross-sectional structure of the shunt area in the memory cell array of the semiconductor memory device according to the embodiment, taken along X-X in FIG. 9.
Figure 11:
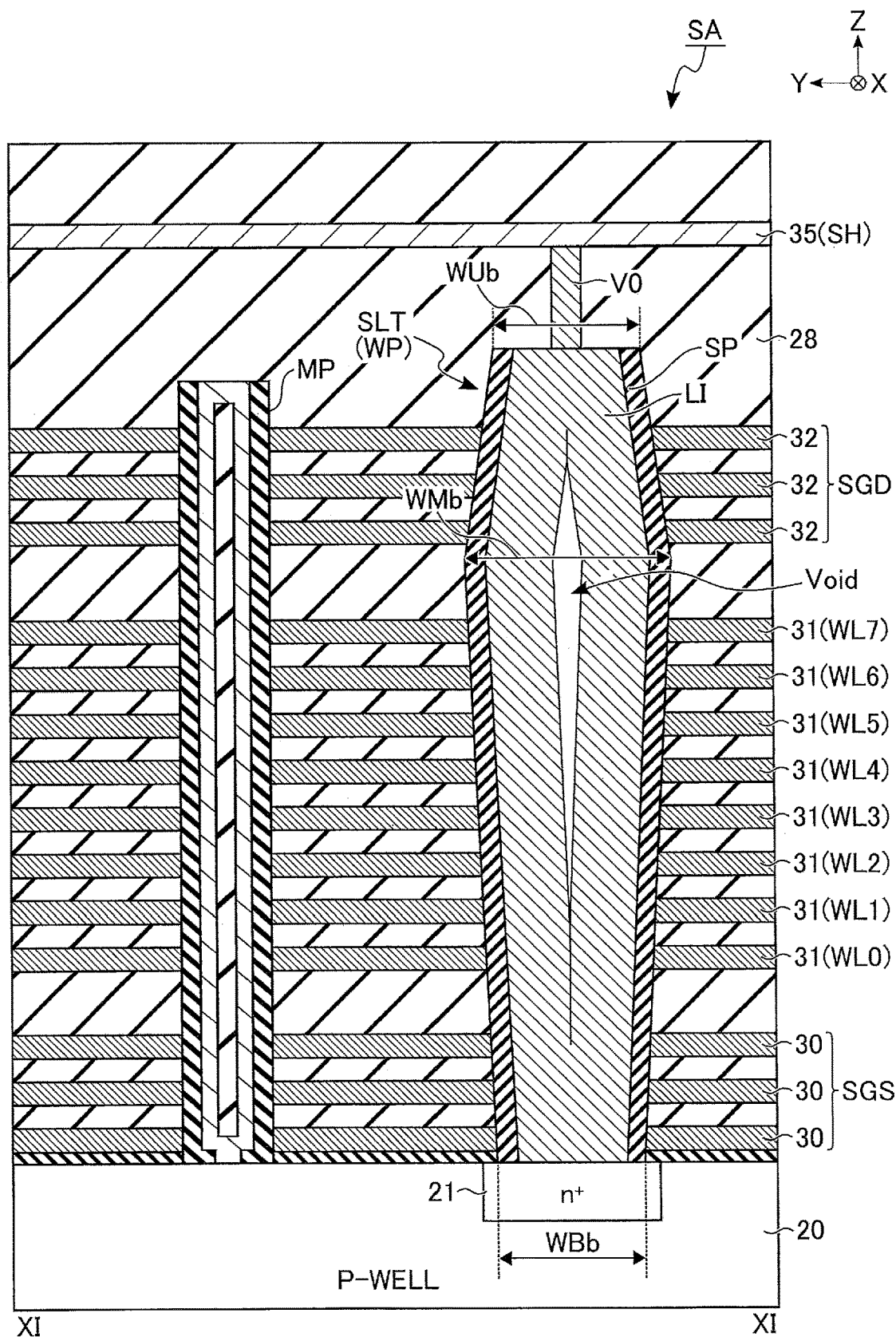
FIG. 11 is a cross-sectional view showing an exemplary cross-sectional structure of the shunt area in the memory cell array of the semiconductor memory device according to the embodiment, taken along XI-XI in FIG. 9.

FIGS. 10 and 11 each show exemplary cross-sectional structures of the shunt area SA in the memory cell array 10 included in the semiconductor memory device 1 according to the embodiment. The cross-sectional structure of the shunt area SA in the memory cell array 10, and differences between a normal portion NP and a wide portion WP of the slit SLT, will be explained with reference to FIGS. 10 and 11.

FIG. 10 includes a cross section of a memory pillar MP and a normal portion NP of a slit SLT, taken along X-X of FIG. 9. As illustrated in FIG. 10, the memory cell array 10 of the shunt area SA further includes a conductive layer 35.

The conductive layer 35 may be provided on the insulating layer 28. The conductive layer 35 may be formed into a line extending in the Y direction, and is used as a shunt line SH. The conductive layer 35 may contain copper. A pillar-shaped contact V0 is provided on the top surface of the contact LI in the slit SLT. The top surface of the contact V0 is in contact with the conductive layer 35, or in other words a shunt line SH. The contacts LI in a plurality of slits SLT arranged in the Y direction are electrically connected to the conductive layer 35. That is, the conductive layer 35 establishes a short circuit between the contacts LI.

A normal portion NP of a slit SLT may be bow-shaped, having a middle portion with respect to the Z direction being bulged. Here, "WBn" represents the width of the normal portion NP of the slit SLT at the bottom, "WMn" represents the width of the widest portion of the normal portion NP of the slit SLT at the middle, and "WUn" represents the width of the normal portion NP of the slit SLT at the top. In the normal portion NP of the slit SLT, WMn is greater than WBn and greater than WUn.

In the normal portion NP of the slit SLT, a seam is formed in the contact LI. The seam in the normal portion NP of the slit SLT intersects at least the portion of the slit SLT corresponding to WMn. The "seam" described in the specification represents the contact portion of components that have grown in a slit from the two facing surfaces by chemical vapor deposition (CVD) or the like and in contact with each other. In such a portion, the components will not be continuously formed, but a boundary surface will remain. This seam may be identified in the cross section intersecting the extending direction of the slit SLT.

FIG. 11 includes a cross section of a memory pillar MP and a wide portion WP of the slit SLT, taken along XI-XI of FIG. 9. As illustrated in FIG. 11, the cross-sectional structure including a wide portion WP of the slit SLT differs from the cross-sectional structure including the normal portion NP of the slit SLT in FIG. 10, only in the shape of the slit SLT.

In a manner similar to the normal portion NP, the wide portion WP of the slit SLT is bow-shaped. Here, "WBb" represents the width of the wide portion WP of the slit SLT at the bottom, "WMb" represents the width of the widest portion of the wide portion WP of the slit SLT at the middle, and "WUb" represents the width of the wide portion WP of the slit SLT at the top. In the wide portion WP of the slit SLT, WMb is greater than WBb and greater than WUb. In comparison of the wide portion WP and normal portion NP of the slit SLT, WBb, WMb and WUb are greater than WBn, WMn and WUn, respectively.

A void is formed in the contact LI in the wide portion WP of the slit SLT. The void formed in the wide portion WP of the slit SLT intersects the portion of the slit SLT corresponding to WMb. The "void" described in the specification represents a space surrounded by the components that have grown in the slit by CVD or the like when forming components in the slit. This void may be identified in the cross section intersecting the extending direction of the slit SLT.

The structure of the shunt area SA in the memory cell array 10 incorporated in the semiconductor memory device 1 according to the embodiment is not limited to the above. The number of contacts V0 that couple the shunt line SH to the contacts LI may be freely designed. To short-circuit the contacts LI, a conductive layer above the conductive layer 35 may be used. The contacts V0 may be provided in either normal portions NP or wide portions WP of the slit SLT. If the contacts V0 are provided in the wide portions WP of the slit SLT, the margin of error can be increased at an overlaying process for formation of contacts V0.

[2] METHOD FOR MANUFACTURING SEMICONDUCTOR MEMORY DEVICE 1

Figure 12:
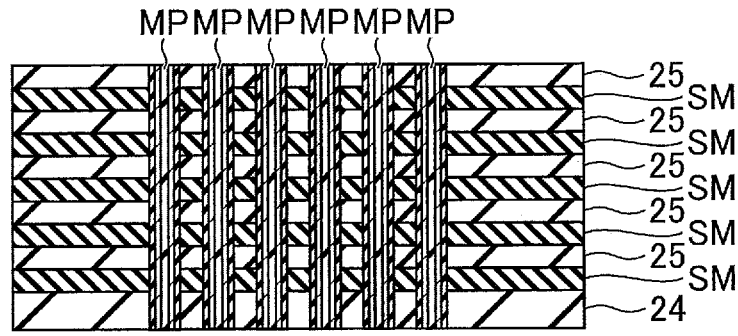
FIG. 12 includes cross-sectional views indicating an exemplary flow of a replacement process in the semiconductor memory device according to the embodiment.
Figure 12:
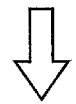
Figure 12:
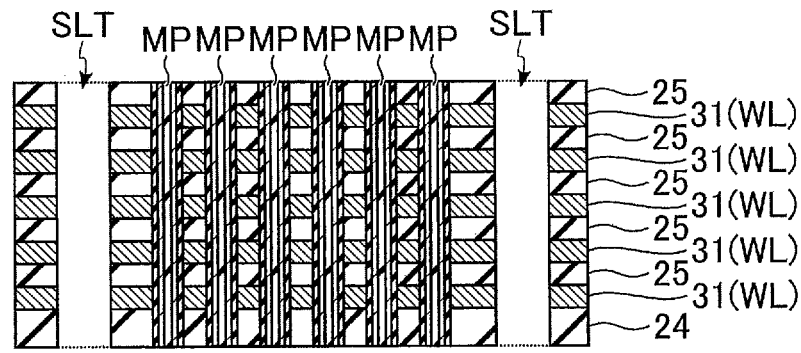
Figure 12:
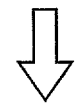
Figure 12:
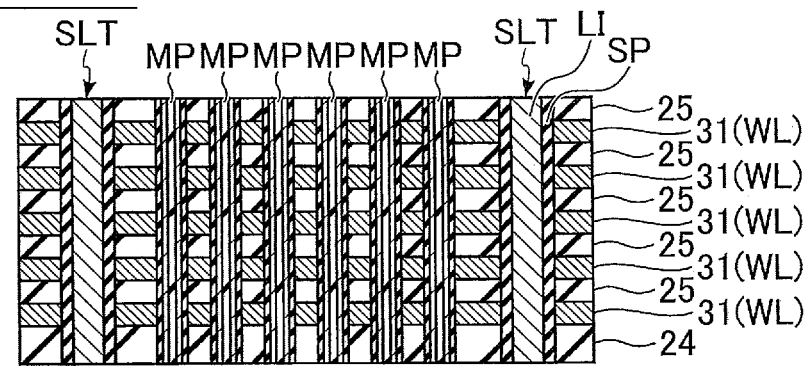

In the semiconductor memory device 1 having memory cells three-dimensionally stacked, wirings such as word lines WL are stacked. To prepare such stacked wirings, a replacement process adopting sacrificial members has been known. FIG. 12 shows cross-sectional views indicating an exemplary flow of the replacement process in the semiconductor memory device 1 according to the embodiment, with the cross sections of the memory area MA partially simplified. (1) to (3) in FIG. 12 represent typical steps of the replacement process.

As illustrated in (1) of FIG. 12, sacrificial members SM are stacked. That is, the insulating layers 25 and sacrificial members SM are alternately stacked, and memory pillars MP are formed in such a manner as to penetrate through the stacked insulating layers 25 and sacrificial members SM. The sacrificial members SM may include silicon nitride. In the region not illustrated here, the end portions of the sacrificial members SM are processed to form a stepped structure of sacrificial members SM in the hookup area HA. Thereafter, an insulating layer 28 is embedded in the stepped portion of the stepped structure, and the top surface of the structure on the wafer is planarized by chemical mechanical polishing (CMP) or the like.

Next, as illustrated in (2) of FIG. 12, the sacrificial members SM are removed. That is, slits SLT are formed to partition the stacked sacrificial members SM. With the etching through the slits SLT, the stacked sacrificial members SM are selectively removed. At this step, the three-dimensional structure from which the sacrificial members SM have been removed is sustained by the memory pillars MP and the like. Thereafter, conductive layers are formed by CVD or the like in a space from which the sacrificial members SM have been removed. Then, the conductor is removed from the slit SLT, and the conductive layers 30 to 32 of different levels are individually isolated.

Finally, as illustrated in (3) of FIG. 12, with the spacer SP and contact LI formed in the slits SLT, the slits SLT are filled in. An exemplary flow of the filling process of slits SLT in the semiconductor memory device 1 according to the embodiment will be explained with reference to FIG. 13.

FIG. 13 includes a plan view including a normal portion NP and a wide portion WP of a slit SLT, a cross section including a cross-sectional structure of a normal portion NP taken along A-A' of the plan view, and a cross section including a cross-sectional structure of a wide portion WP taken along B-B' of the plan view. As illustrated in FIG. 13, the filling process of a slit SLT may demonstrate different states corresponding to steps S11 to S13.

In the processing operation at step S11, spacers SP are formed, and an etch-back process is executed. In particular, first, an insulating film corresponding to the spacers SP is formed by CVD or the like. This insulating film is formed not only on the side surfaces of the slits SLT, but also on the bottoms of the slits SLT. The etch-back process is executed to remove the insulating film from the bottoms of the slits SLT. As a result, the surface of the semiconductor substrate (N-type semiconductor region 21) is exposed at the bottom of each slit SLT.

At steps S12 and S13, the process of filling the slits SLT with a conductor 50 is executed. The time lapsed in the filling process differs between steps S12 and S13. To fill the slits SLT with the conductor 50, CVD may be employed. That is, for the formation of the conductor 50, a chemical reaction with a gas may be adopted. The details of steps S12 and S13 will be explained below.

First, as illustrated under step S12, the top portion of the normal portion NP of the slit SLT comes to be closed by the conductor 50, as the conductor 50 is being formed. A void is thereby created in the middle portion of the normal portion NP of the slit SLT. On the other hand, the top portion in the wide portion WP of the slit SLT has a greater width than the width in the normal portion NP, and has a greater length than the width of the normal portion NP. As a result, the opening is maintained in the wide portion WP of the slit SLT. Here, with the wide portion WP and normal portion NP of the slit SLT being continuously formed, a gas can be supplied to the void of the normal portion NP through the opening of the wide portion WP.

As the formation of the conductor 50 further proceeds after step S12, the conductor 50 is formed in the void of the normal portion NP by the gas supplied through the wide portion WP of the slit SLT. As a result, a seam is formed in the normal portion NP of the slit SLT, as illustrated in step S13. In the wide portion WP of the slit. SLT, its top portion is closed by the formed conductor 50, creating a void in the middle portion of the wide portion WP. Thereafter, the conductor 50 formed outside the slit SLT is removed, for example by CMP. The structure of the slit SLT including the spacer SP and contact LI is thereby completed.

[3] EFFECTS OF EMBODIMENT

The above-described semiconductor memory device 1 according to the embodiment can improve yields. The effects of the semiconductor memory device 1 according to the embodiment will be explained in detail below by referring to a comparative example.

FIG. 14 shows an exemplary structure of slits SLT of the comparative example of the present embodiment, focusing on a region including two adjacent slits SLT in the memory area MA. As illustrated in FIG. 14, the slits SLT in this comparative example have normal portions NP only, with no wide portion WP provided. When each of the slits SLT is formed to have a uniform width, the top portions of the slits SLT are likely to be closed approximately at the same timing during the filling process. As a result, a continuous void is formed in the contacts LI of the slits SLT.

Such a void continuously formed through the contact LI may cause a defect in a downstream operation of the semiconductor processing. In particular, when packaging the semiconductor memory device 1, a semiconductor substrate, or in other words a semiconductor chip, is processed to be thinned. Due to the warping of the semiconductor chip subjected to the thinning process, a void formed in the contact LI may introduce a crack in the chip. Cracks in chips would lower the yields, and therefore should be suppressed.

In order to suppress cracking of chips, enhancement of the deflective strength of the contact LI is effective. The deflective strength of the contact LI demonstrates a correlation with the length of a void. It is therefore considered that a shortened void in the contact LI will effectively suppress cracking of the chip. The semiconductor memory device 1 according to the embodiment has a structure in which voids are discontinuously formed in the slits SLT.

FIG. 15 shows an exemplary structure of slits SLT according to the embodiment, focusing on the same region as that of FIG. 14. As illustrated in FIG. 15, each slit SLT has a structure in which the slit width is intentionally varied. Specifically, each slit SLT has normal portions NP and wide portions WP. The wide portions WP may be arranged in the shunt area SA, and throughout the entire memory cell array 10, the wide portions WP are arranged approximately at regular intervals.

As explained with reference to FIG. 13, the wide portions WP of the slit SLT are used as a passage for filling the voids created in the normal portions NP during the filling process of the slit SLT. This produces a structure in which a seam is formed in the normal portions NP of the slit SLT, while a void remains in the wide portions WP in the semiconductor memory device 1 according to the embodiment. That is, the voids in the slit SLT are discontinuously formed because of the seams formed in the normal portions NP.

As discussed above, the semiconductor memory device 1 according to the embodiment includes slits SLT whose width is increased at intervals so that seams can be formed in the contact LI. These seams can make the voids in the contact LI short and discontinuous, enhancing the deflective strength of the contact LI. In this manner, the semiconductor memory device 1 according to the embodiment can suppress cracking of a chip, which tends to be caused from a void in the contact LI, and can thereby improve yields.

[4] MODIFICATION EXAMPLES

Various modifications may be made to the semiconductor memory device 1 according to the embodiment. The first to sixth modification examples will be discussed below, focusing on differences with respect to the present embodiment.

Modification Example 1

In the semiconductor memory device 1 according to the embodiment, each slit SLT may be configured to include narrow portions TP in place of wide portions WP. Such a structure may be explained below as a first modification example.

Figure 16:
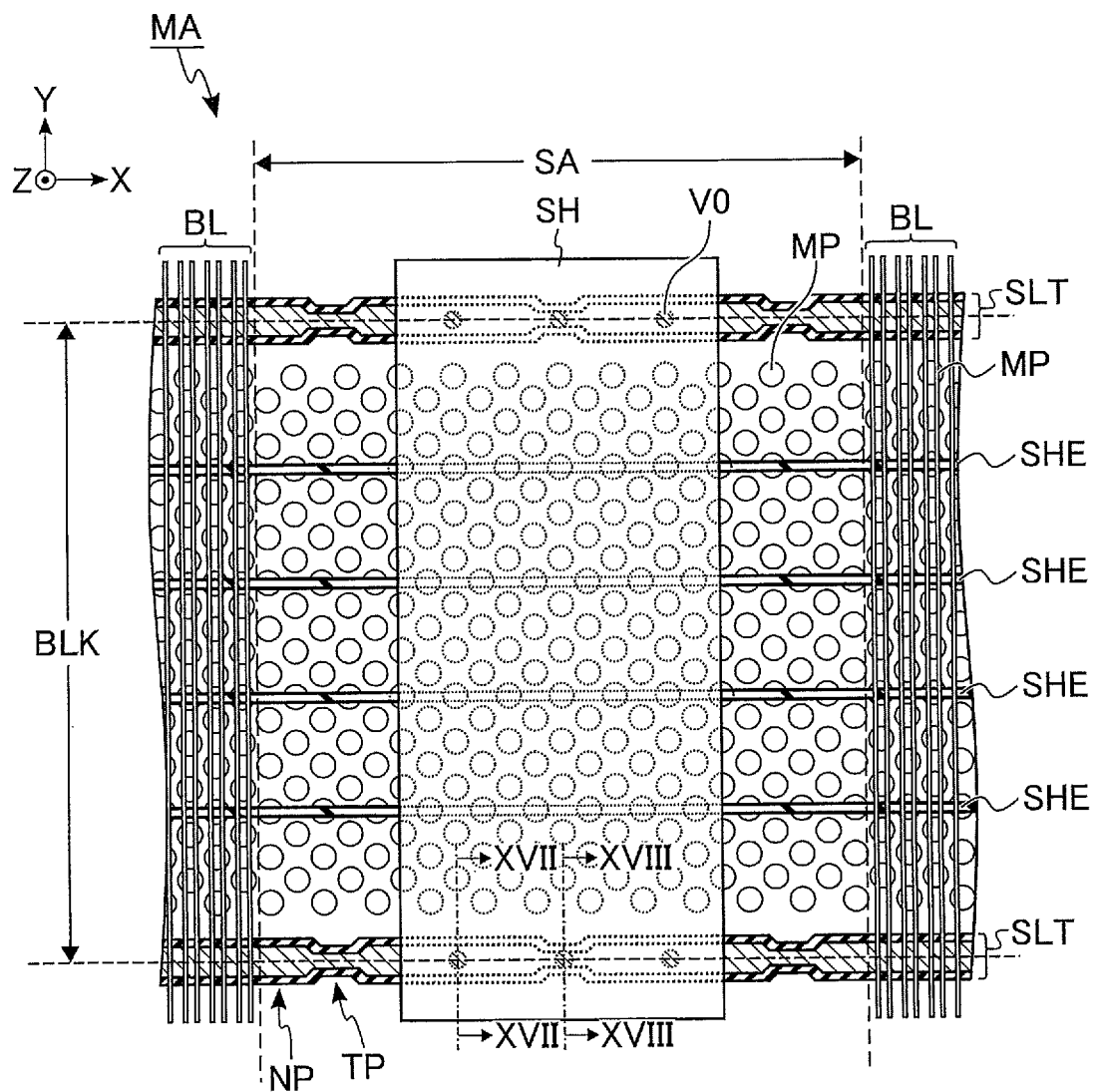
FIG. 16 is a plan view showing a detailed planar layout of a shunt area in a memory cell array of a semiconductor memory device according to a first modification example of the embodiment.

FIG. 16 shows an exemplary planar layout of a shunt area SA in a memory cell array 10 of the semiconductor memory device 1 according to the first modification example of the embodiment, focusing on a region similar to FIG. 9. As illustrated in FIG. 16, the planar layout of the memory cell array 10 according to the first modification example differs from that of the embodiment illustrated in FIG. 9, only in the shape of the slits SLT.

Specifically, in the shunt area SA according to the first modification example, each slit SLT includes at least one narrow portion TP. In the illustrated example, each slit SLT includes three narrow portions TP separately arranged in the shunt area SA. In the shunt area SA and outside the shunt area SA, a plurality of normal portions NP are arranged in the X direction to be adjacent to a narrow portion TP. A narrow portion TP of the slit SLT has a smaller width in the Y direction than the width of a normal portion NP of the slit SLT in the Y direction. A normal portion NP of the slit SLT has a length in the X direction greater than the length of the narrow portion TP of the slit SLT in the X direction and greater than the width of the narrow portion TP in the Y direction. The length of the narrow portion TP in the X direction can be freely designed. The arrangement of narrow portions TP may differ among the slits SLT.

Figure 17:
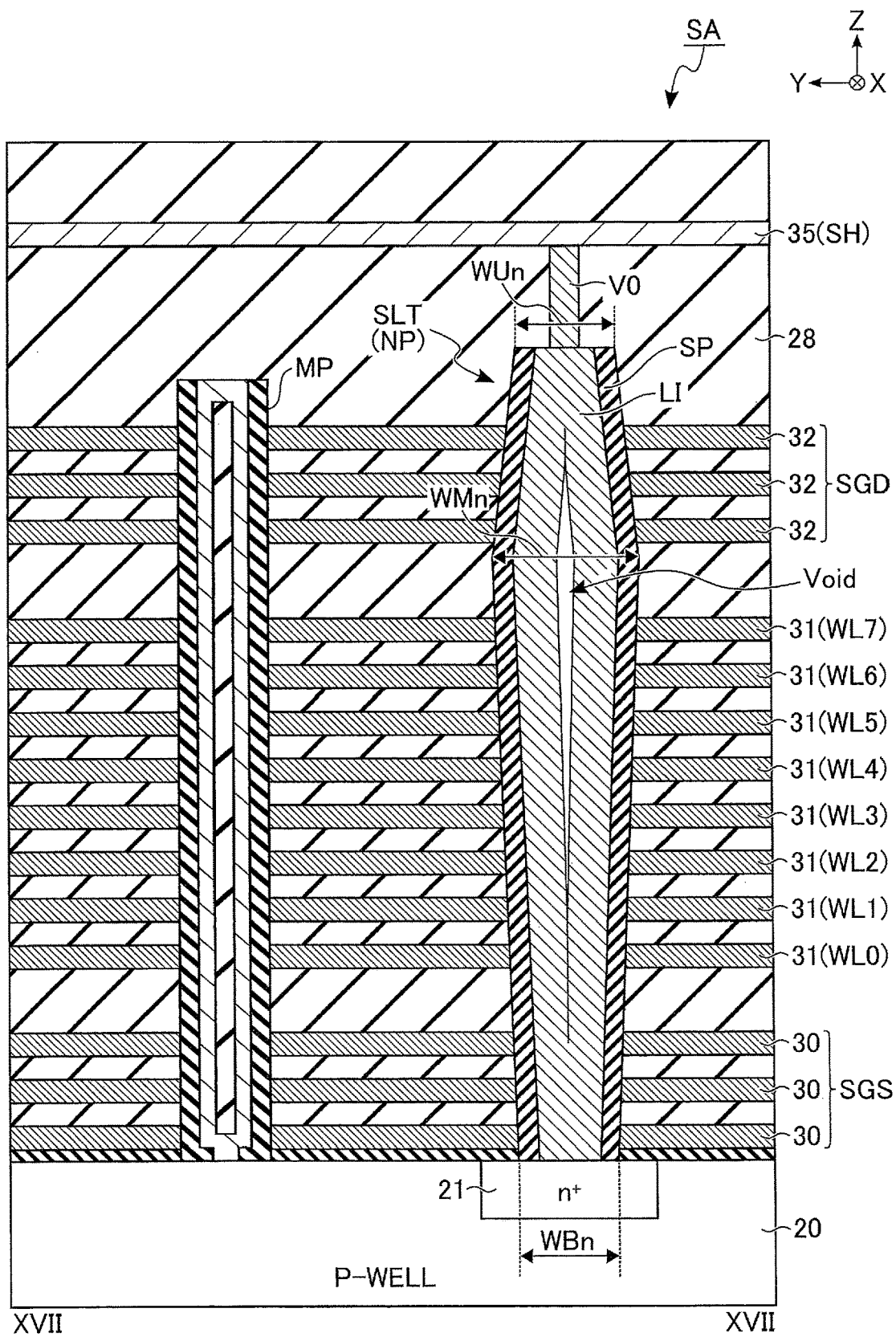
FIG. 17 is a cross-sectional view showing an exemplary cross-sectional structure of the shunt area in the memory cell array of the semiconductor memory device according to the first modification example of the embodiment, taken along XVII-XVII in FIG. 16.
Figure 18:
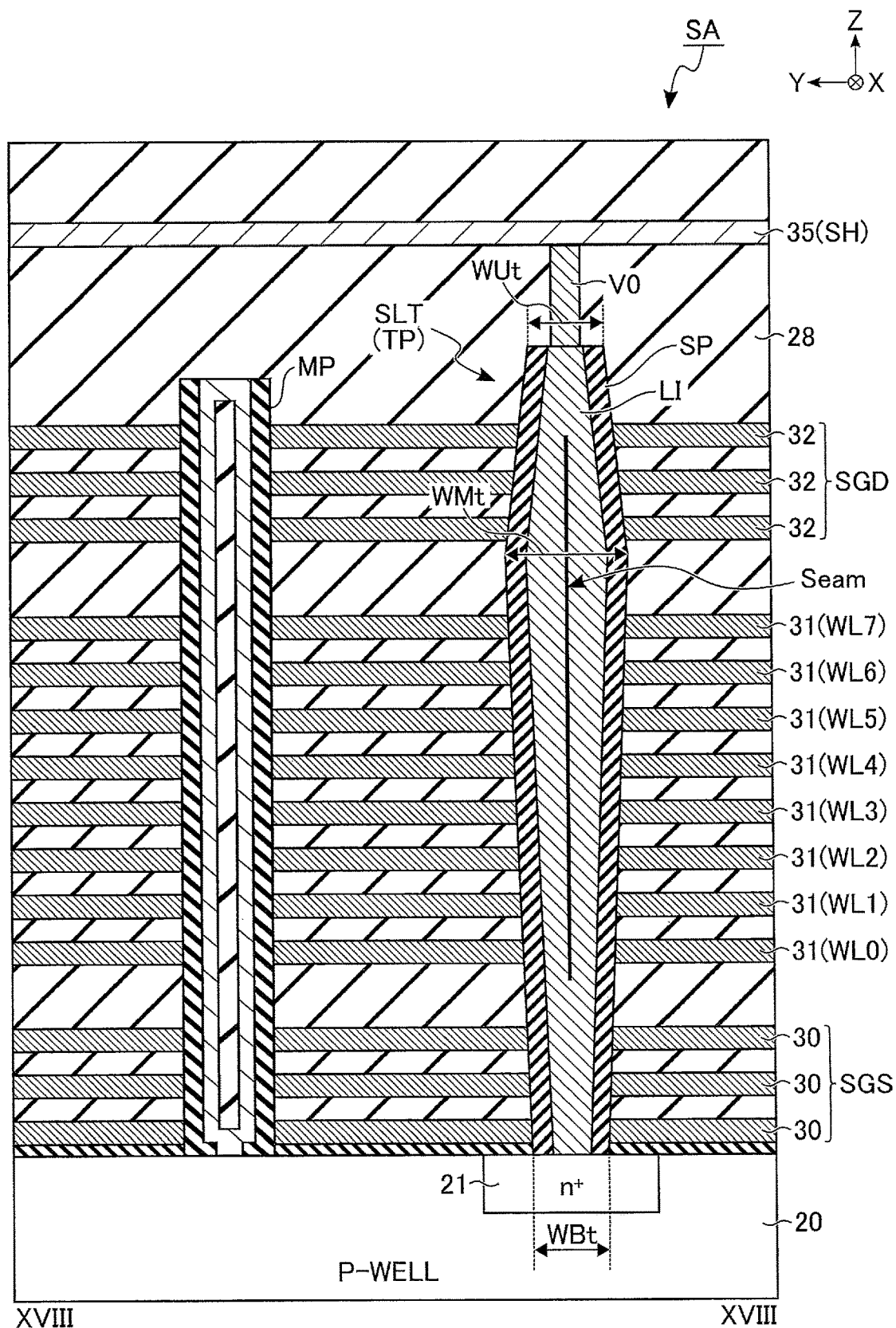
FIG. 18 is a cross-sectional view showing an exemplary cross-sectional structure of the shunt area in the memory cell array of the semiconductor memory device according to the first modification example of the embodiment, taken along XVIII-XVIII in FIG. 16.

FIGS. 17 and 18 each show exemplary cross-sectional structures of the shunt area SA in the memory cell array 10 included in the semiconductor memory device 1 according to the first modification example. The differences between a normal portion NP and a narrow portion TP of the slit SLT will be explained with reference to FIGS. 17 and 18. The memory cell array 10 according to the first modification example has the same cross-sectional structure as that of the embodiment except for the shape of the slit SLT.

FIG. 17 includes a cross section of a memory pillar MP and a normal portion NP of a slit SLT, taken along XVII-XVII of FIG. 16. As illustrated in FIG. 17, the normal portion NP of the slit SLT according to the first modification example has a void in the contact LI. The void created in the normal portion NP of the slit SLT intersects at least a portion of the slit SLT corresponding to WMn.

FIG. 18 includes a cross section of a memory pillar MP and a narrow portion TP of a slit SLT, taken along XVIII-XVIII of FIG. 16. As illustrated in FIG. 18, the cross-sectional structure including a narrow portion TP of the slit SLT differs from the cross-sectional structure including the normal portion NP of the slit SLT in FIG. 17, only in the shape of the slit SLT.

In a manner similar to the normal portion NP, the narrow portion TP of the slit SLT is bow-shaped. Here, "WBt" represents the width of the narrow portion TP of the slit SLT at the bottom, "WMt" represents the width of the widest portion of the narrow portion TP of the slit SLT at the middle, and "WUt" represents the width of the narrow portion TP of the slit SLT at the top. In the narrow portion TP of the slit SLT, WMt is greater than WBt and greater than WUt. In comparison of the narrow portion TP and normal portion NP of the slit SLT, WBt, WMt and WUt are smaller than WBn, WMn and WUn, respectively.

The narrow portion TP of the slit SLT according to the first modification example has a seam in the contact LI. The seam formed in the narrow portion TP of the slit SLT intersects at least the portion of the slit SLT corresponding to WMt. The rest of the structure of the semiconductor memory device 1 according to the first modification example is the same as that of the embodiment.

With reference to FIG. 19, an exemplary flow of the filling process of slits SLT in the semiconductor memory device 1 according to the first modification example will be explained. FIG. 19 shows a plan view including a normal portion NP and a narrow portion TP of a slit SLT, a cross section including a cross-sectional structure of a normal portion NP taken along A-A' of the plan view, and a cross section including a cross-sectional structure of a narrow portion TP taken along B-B' of the plan view. As illustrated in FIG. 19, the filling process of a slit SLT may demonstrate different states corresponding to steps S21 to S23.

In the processing operation at step S21, the formation of spacers SP and an etch-back process are executed in a manner similar to step S11 of the embodiment. As a result, spacers SP are formed on the side surfaces of the slit SLT, and the surface of the semiconductor substrate is exposed at the bottom of the slit SLT. Thereafter, at steps S22 and S23, the process of filling the slit SLT with the conductor 50 is conducted in a manner similar to steps S12 and S13 of the embodiment. The time lapsed in the filling process differs between steps S22 and S23.

In particular, first, as illustrated in step S22, the top portion of the narrow portion TP of the slit SLT comes to be closed by the conductor 50, as the conductor 50 is being formed. Then, a void is created in the middle portion of the narrow portion TP of the slit SLT. On the other hand, the top portion in the normal portion NP of the slit SLT has a greater width than the width in the narrow portion TP, and therefore the opening is maintained in the normal portion NP of the slit SLT. Here, with the narrow portion TP and normal portion NP of the slit SLT being continuously formed, a gas can be supplied to the void of the narrow portion TP through the opening of the normal portion NP.

As the formation of the conductor 50 further proceeds after step S22, the conductor 50 is formed in the void of the narrow portion TP from the gas supplied through the normal portion NP of the slit SLT. As a result, as illustrated under step S23, a seam is formed in the narrow portion TP of the slit SLT. In the normal portion NP of the slit SLT, its top portion is closed by the formed conductor 50, creating a void in the middle portion of the normal portion NP. Thereafter, the conductor 50 formed outside the slit SLT is removed, for example, by CMP. In this manner, the structure of a slit SLT including spacers SP and a contact LI is completed.

The effect of the first modification example will be described below. FIG. 20 shows an exemplary structure of slits SLT according to the first modification example, focusing on the same region as that of FIG. 15. As illustrated in FIG. 20, each slit SLT has a structure in which the slit width is intentionally varied. Specifically, each slit SLT has normal portions NP and narrow portions TP. The narrow portions TP may be arranged in the shunt area SA, and as the entire memory cell array 10, the narrow portions TP are arranged approximately at regular intervals.

As explained with reference to FIG. 19, the normal portions NP of the slit SLT are used as a passage for filling the voids created in the narrow portions TP during the filling process of the slit SLT. This produces a structure in which a seam is formed in the narrow portions TP of the slit SLT, while a void remains in the normal portions NP in the semiconductor memory device 1 according to the first modification example. That is, the voids in the slit SLT are discontinuously formed because of the seams formed in the narrow portions TP.

As discussed above, in the semiconductor memory device 1 according to the first modification example, a seam can be formed in the contact LI by reducing the width of the slit SLT at intervals so that the deflective strength of the contact LI can be improved. The semiconductor memory device 1 according to the first modification example can thereby suppress the cracking of a chip from the void of the contact LI, and can improve yields in the same manner as the embodiment.

Modification Example 2

In the semiconductor memory device 1 according to the embodiment, the wide portions WP of each slit SLT may be arranged in the hookup area HA. Such an arrangement will be explained below as a second modification example with reference to the drawings.

FIG. 21 shows an example of a detailed planar layout of the hookup area HA in a memory cell array 10 of the semiconductor memory device 1 according to second modification example of the embodiment, focusing on a region similar to FIG. 7. As illustrated in FIG. 21, each slit SLT of the hookup area HA1 in the memory cell array 10 includes at least one wide portion WP in the second modification example of the embodiment.

The wide portion WP of each slit SLT in the hookup area HA is arranged so as to avoid any contact at least with contacts CC. In the hookup area HA, the arrangement and number of wide portions WP may differ, or may be the same, among the slit SLTs. The rest of the structure of the semiconductor memory device 1 according to the second modification example of the embodiment is the same as that of the embodiment.

With this structure, the semiconductor memory device 1 according to the second modification example of the embodiment can create a seam in the contact LI in the hookup area HA so that the deflective strength of the contact LI can be improved in the hookup area HA. The semiconductor memory device 1 according to the second modification example can thereby suppress the cracking of a chip from the void of the contact LI, and can improve yields in the same manner as the embodiment.

Modification Example 3

In the semiconductor memory device 1 according to the embodiment, a memory pillar MP may be designed to a plurality of pillars connected in the Z direction. Furthermore, the etching process for forming slits SLT may be divided into several producing steps. Such an arrangement will be explained below as a third modification example with reference to the drawings.

FIG. 22 shows an exemplary cross-sectional structure of the shunt area SA in the memory cell array 10 of the semiconductor memory device 1 according to the third modification example of the embodiment, focusing on a region similar to FIG. 10. As illustrated in FIG. 22, a memory pillar MP includes a lower pillar LMP and an upper pillar UMP, and a slit SLT includes a lower slit LST and an upper slit UST. The conductive layers 31 include a plurality of conductive layers 31L and a plurality of conductive layers 31U provided above the conductive layers 31L.

Specifically, each memory pillar MP has a structure in which an upper pillar UMP is provided above a lower pillar LMP. Each of the lower pillar LMP and the upper pillar UMP may have a structure similar to a memory pillar MP described in the embodiment. The semiconductor layer 41 in the lower pillar LMP is in contact with the P-type well region 20. The top portion of the semiconductor layer 41 in the lower pillar LMP is coupled to the bottom portion of the semiconductor layer 41 of the upper pillar UMP. In the memory area MA, the top portion of the semiconductor layer 41 in the upper pillar UMP is in contact with a contact CV. The stacked film 42 in the lower pillar LMP and the stacked film 42 in the upper pillar UMP are continuously formed, or separately formed.

Each slit SLT has a structure in which an upper slit UST is provided above the lower slit LST. The lower slit LST and the upper slit UST are formed in different etching steps. The slit SLT therefore has a constricted shape at the connected portion of the lower slit LST and the upper slit UST. On the other hand, the portion in the lower slit LST and the portion in the upper slit UST may be formed in the same operation. If this is the case, the spacer SP is continuously formed in the slit SLT, and the contact LI is also continuously formed in the slit SLT. In the same manner as in the embodiment, a contact V0 is coupled to the top portion of the contact LI.

The conductive layers 30 and conductive layers 31L are pierced through by the lower pillar LMP, and partitioned by the lower slit LST. The conductive layers 31U and conductive layers 32 are pierced through by the upper pillar UMP, and partitioned by the upper slit UST. The top end of the lower slit LST is approximately at the same height as the top end of the lower pillar LMP. On the other hand, the top end of the upper slit UST is at a higher level than the top end of the upper pillar UMP. The insulating layer 29 between the uppermost conductive layers 31L and the lowermost conductive layers 31U has a greater thickness than an insulating layer between any two adjacent conductive layers 31L and an insulating layer between any two adjacent conductive layers 31U. The rest of the structure of the semiconductor memory device 1 according to the third modification example is the same as that of the embodiment.

With a wide portion WP provided in the upper slit UST, the semiconductor memory device 1 according to the third modification example of the embodiment can create a seam in the contact LI, thereby improving the deflective strength of the contact LI. The semiconductor memory device 1 according to the third modification example can thereby suppress the cracking of a chip from the void of the contact LI, and can improve yields in the same manner as the embodiment.

The top portion of the lower pillar LMP may be designed to have an increased width at the portion in which the insulating layer 29 intersects the memory pillar MP, or in other words the coupling portion of the lower pillar LMP and the upper pillar UMP. In a similar manner, the lower slit LST may be designed to have an increased width at the portion in which the insulating layer 29 intersects the lower slit LST, or in other words the coupling portion of the lower slit LST and the upper slit UST. This reduces the difficulties in overlaying the lower pillar LMP and upper pillar UMP and in overlaying the lower slit LST and upper slit UST, and thereby improves yields.

In the third modification example of the embodiment, a structure in which a memory pillar MP has two pillars connected to each other and a slit SLT has two slits connected to each other has been discussed, but the structure is not limited thereto. The memory pillar MP may have three or more pillars connected to each other, and the slit SLT may have three or more slits connected to each other. The types of conductive layers through which the respective connected pillars in the memory pillar MP pierce may be freely determined.

Furthermore, in the third modification example of the embodiment, a slit SLT is divided into a lower slit LST and an upper slit UST, but the structure is not limited thereto. Even when a memory pillar MP has a structure of multiple pillars connected to each other, a slit SLT may be formed in one etching process. If this is the case, the step of forming the lower slit LST is omitted, which reduces production costs of the semiconductor memory device.

Modification Example 4

In the semiconductor memory device 1 according to the embodiment, the wide portions WP of each slit SLT may be arranged in an area other than the shunt area SA and hookup area HA. Such an arrangement will be explained below as a fourth modification example with reference to the drawings.

In the semiconductor memory device 1 according to the fourth modification example of the embodiment, the peripheral circuit such as a row decoder module 15 is arranged beneath the memory cell array 10. According to the fourth modification example of the embodiment, the memory area MA of the memory cell array 10 of the embodiment includes at least one through contact area C4T. In the same manner as the shunt area SA according to the embodiment, the through contact area C4T extends in the Y direction.

Figure 23:
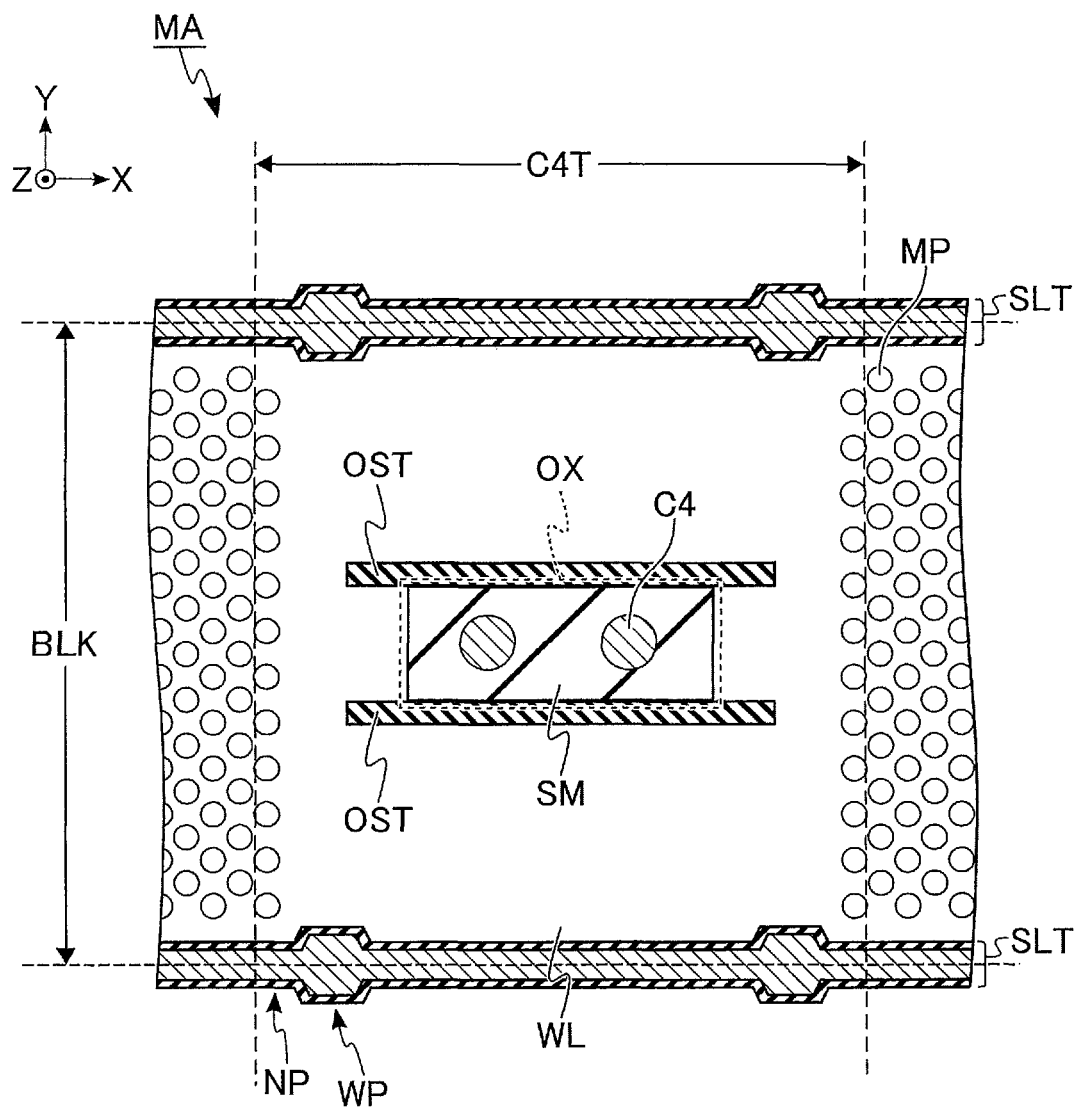
FIG. 23 is a plan view showing a detailed planar layout of a through contact area in a memory cell array of a semiconductor memory device according to a fourth modification example of the embodiment.

FIG. 23 shows an example of a detailed planar layout of a through contact area C4T in the memory cell array 10 of the semiconductor memory device 1 according to the fourth modification example of the embodiment. As illustrated in FIG. 23, the memory cell array 10 of the through contact area C4T includes a plurality of slits OST and a plurality of contacts C4.

Each slit OST has a structure in which an insulator is embedded and has a portion extending in the X direction. In the illustrated example, two slits OST are arranged between adjacent slits SLT. The two slits OST between the adjacent slits SLT are separately disposed, and arranged in the Y direction. The area defined between the two slits OST arranged between the adjacent slits SLT includes a through area OX. In the through area OX, a sacrificial member SM used in the replacement process still remains.

The contacts C4 are contained in the through area OX. That is, a contact C4 is arranged between the two slits OST, which are arranged between adjacent slits SLT. The contact C4 pierces through the layer stacked structure of the memory cell array 10. The contact C4 electrically couples the wirings provided beneath the memory cell array 10 and the wirings provided above the memory cell array 10. One or more contacts C4 may be provided in the through area OX.

In the through contact area C4T, the select gate line SGD is separated into separated portions on both sides of the through contact area C4T in the X direction, although not illustrated in the drawing. If this is the case, the separated portions of the select gate line SGD are electrically coupled to each other via the wirings provided above the layer stacked structure of the memory cell array 10. If all the select gate lines SGD in the same block BLK can extend in the X direction within a region around the slits OST and through area OX, the select gate line SGD may not be separated in the through contact area C4T.

FIG. 24 shows an exemplary cross-sectional structure of the memory cell array 10 of the semiconductor memory device 1 according to the fourth modification example of the embodiment, focusing on a cross section including the area similar to FIG. 5 and the through contact area C4T. As illustrated in FIG. 24, the memory cell array 10 according to the fourth modification example of the embodiment further includes conductive layers 60 to 62.

Specifically, a conductive layer 60 is provided above the P-type well region 20 with an insulating layer interposed. Circuits corresponding to a row decoder module 15, a sense amplifier module 16 and the like are provided in the insulating layer between the P-type well region 20 and the conductive layer 60, although these are not shown. The conductive layer 60 may be formed into a plate shape expanding along the XY plane and is employed as a source line SL. The conductive layer 60 contains phosphorous-doped silicon. The conductive layer 60 may have a structure in which the portion included in the through area OX is replaced with an insulator INS.

The slit OST has a portion extending in the Z direction. The top end of the slit OST is included in a layer between the uppermost conductive layer 32 and conductive layer 33. The bottom end of the slit OST is included in the layer in which the conductive layer 60 is provided. Sacrificial members SM are provided in the layers corresponding to the conductive layers 30 and defined by two slits OST. Similarly, sacrificial members SM are provided in the layers corresponding to the conductive layers 31 and defined by two slits OST. In the through contact area C4T, an insulator may be embedded in the layers corresponding to the conductive layers 32.

A conductive layer 61 is arranged between the P-type well region 20 and conductive layer 60, and coupled to the circuit beneath the memory cell array 10. A contact C4 is provided on the conductive layer 61. The contact C4 extends in the Z direction, piercing through the insulating layer and sacrificial members SM in the through contact area C4T. A conductive layer 62 is provided on the contact C4. The conductive layer 62 may be provided in the same layer as the conductive layer 33, and coupled to the circuit above the memory cell array 10. Other contacts or wirings may be provided to establish coupling between the contact C4 and conductive layer 62. The rest of the structure of the semiconductor memory device 1 according to the fourth modification example of the embodiment is the same as that of the embodiment.

In the semiconductor memory device 1 according to the fourth modification example of the embodiment, each slit SLT includes wide portions WP similar to those in the embodiment, in the through contact area C4T. With this structure, the semiconductor memory device 1 according to the fourth modification example of the embodiment can create a seam in the contact LI at least in the through contact area C4T, thereby increasing the deflective strength of the contact LI. The semiconductor memory device 1 according to the fourth modification example can thereby suppress the cracking of a chip from a void of the contact LI, and can improve yields in the same manner as the embodiment.

In the semiconductor memory device 1 according to the fourth modification example of the embodiment, wide portions WP of the slit SLT may be provided in the through contact area C4T so that a defect of a wide portion WP of the slit SLT being in contact with a memory pillar MP for data storage can be eliminated. The through contact area C4T may be provided in the hookup area HA. With a through contact area C4T formed in the hookup area HA, the aforementioned structure of the select gate line SGD may be omitted in this through contact area C4T.

Modification Example 5

In the semiconductor memory device 1 according to the fifth modification example of the embodiment, each slit SLT may be formed of an insulator. Such an arrangement will be explained below as a fifth modification example with reference to the drawings.

FIG. 25 shows an exemplary cross-sectional structure of a memory cell array 10 in a semiconductor memory device 1 according to the fifth modification example of the embodiment, focusing on a region similar to FIG. 24. As illustrated in FIG. 25, the structure of the memory cell array 10 according to the fifth modification example of the embodiment differs from the structure of the memory cell array 10 according to the fourth modification example of the embodiment illustrated in FIG. 24, only in the structure of a slit SLT.

In particular, the slit SLT according to the fifth modification example of the embodiment is filled with an insulator 70. The slit SLT is provided with wide portions WP and subjected to a filling process similar to the process explained with reference to FIG. 13 so that a seam can be formed in the insulator 70. A contact for the source line SL (conductive layer 60) may be provided in the through contact area C4T, although it is omitted from the drawing. The rest of the structure of the semiconductor memory device 1 according to the fifth modification example of the embodiment is the same as that of the fourth modification example.

As discussed above, a seam can be formed in the insulator 70 in the semiconductor memory device 1 according to the fifth modification example of the embodiment. In the same manner as the seam created in the contact LI according to the embodiment, the seam formed in the insulator 70 can improve the deflective strength of the insulator 70. Thus, the semiconductor memory device 1 according to the fifth modification example can suppress cracking of a chip, which tends to be caused from a void in the insulator 70, and can improve yields.

Modification Example 6

In the semiconductor memory device 1 according to the embodiment, each slit SLT may have a partially constricted form. Such an arrangement will be explained below as a sixth modification example of the embodiment, with reference to the drawings.

Figure 26:
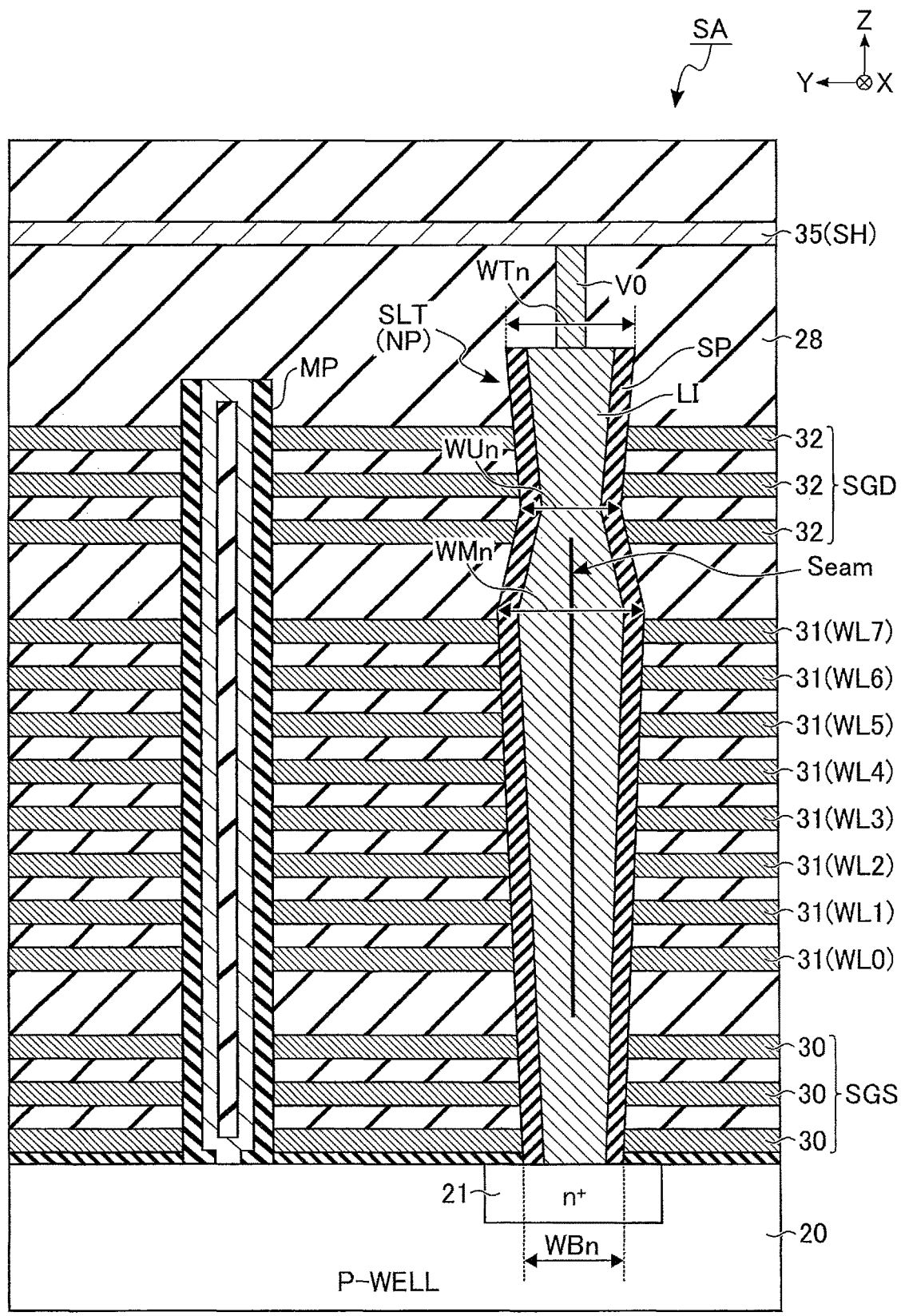
FIG. 26 is a cross-sectional view showing an exemplary cross-sectional structure of a shunt area in a memory cell array of a semiconductor memory device according to a sixth modification example of the embodiment.

FIG. 26 shows an exemplary cross-sectional structure of the memory cell array 10 in the semiconductor memory device 1 according to the sixth modification example of the embodiment, where a region similar to FIG. 10 is illustrated. As illustrated in FIG. 26, the structure of the memory cell array 10 according to the sixth modification example of the embodiment differs from the structure of the memory cell array 10 according to the embodiment illustrated in FIG. 10, only in the form of a slit SLT.

In particular, a slit SLT according to the sixth modification example of the embodiment has a bottom portion corresponding to WBn, a middle portion corresponding to WMn, an upper portion corresponding to WUn each described in the embodiment, and further has an uppermost portion. In comparison to the slit SLT of the embodiment, the slit SLT according to the sixth modification example has a shape in which the uppermost portion has an increased width WTn in the Y direction. That is, WTn is greater than WUn. As a result, the slit SLT has a shape constricted from the uppermost portion toward the middle portion.

With such a shape, if the same filling process as the one illustrated in FIG. 13 is conducted, the conductor 50 will be closed in the upper portion of the slit SLT, for example at step S12. Then, in a manner similar to the embodiment, a seam can be created in the portion of the conductor 50 corresponding to the middle portion of the slit SLT. In the wide portion WP of the slit SLT, which is not illustrated in the drawing, a void is created in its middle portion. The rest of the structure of semiconductor memory device 1 according to the sixth modification example of the embodiment is the same as that of the embodiment.

As discussed above, the semiconductor memory device 1 according to the sixth modification example of the embodiment can create a seam in the contact LI even if the slit SLT does not have a simple bow-shaped form, thereby improving the deflective strength of the contact LI. The semiconductor memory device 1 according to the sixth modification example of the embodiment can thereby suppress the cracking of a chip from the void of the contact LI, and can improve yields in the same manner as the embodiment.

The slit SLT is not limited to a bow-shaped form or the form illustrated in FIG. 26. For instance, the slit SLT may have a reverse-tapered form. With such a structure, when the filling process of the slit SLT is conducted by a chemical reaction with a gas, the opening in the uppermost portion of the slit SLT is the first to react, causing a closure in the opening. However, by maintaining the partially open state without causing near simultaneous closure of the upper portion of the slit SLT, the remaining opening can be used as a passage for filling the void. This can create a seam in the contact LI of the slit SLT, improving the deflective strength of the contact LI. That is, the semiconductor memory device 1, which includes a slit SLT having wide portions WP/narrow portions TP and normal portions NP, can create a seam in the contact LI.

[5] OTHERS

The embodiment and the first to sixth embodiments may be suitably combined. For instance, the embodiment may be combined with the first modification example. If this is the case, the slit SLT includes both a wide portion WP and a narrow portion TP. With the combination of the embodiment with the first modification example, the freedom of design can be improved. In other combinations of the embodiment with the modification examples, the semiconductor memory device 1 can produce effects of the embodiment and the combined modification example.

In the embodiment, the contact LI is formed of a single conductor, but is not limited thereto. The contact LI may be formed of multiple types of conductors. For instance, the contact LI may have a structure in which a metal and a semiconductor are combined, or a structure in which multiple kinds of metals may be combined. When conductors of multiple types are formed in a slit SLT, a contact LI having a seam can be formed in the slit SLT, in the same manner as in the embodiment.

According to the embodiment, a different contact other than the contacts CC, CV or V0 may be provided respectively between the contact CV and conductive layer 33, between the contacts CC and conductive layers 34, and between the contact V0 and conductive layer 35. That is, the conductive layers 31 and conductive layers 34, for example, may be coupled to each other by multiple contacts that are coupled in the Z direction. If the contacts are coupled in the Z direction, a conductive layer may be inserted in the coupling portions. Such a structure may be adopted for any contact.

In the drawings used for the explanation of the embodiment, the memory pillars MP are illustrated as having the same diameter in the Z direction. The pillars are not limited thereto. For instance, a memory pillar MP may be tapered or reverse tapered, or may be bulged (bow-shaped) in the middle portion. According to the embodiment, the memory pillars MP, and contacts CC, CV, V0 and C4 each have a circular cross-section. However, their cross section may be designed to be ellipsoidal or in any shape.

According to the embodiment, the memory cell array 10 has two hookup areas HA1 and HA2, but the embodiment may not be limited thereto. It suffices that at least one hookup area HA is provided in the memory cell array 10. Furthermore, the hookup area HA may be arranged in such a manner as to divide the memory area MA. If only one hookup area HA is arranged, this hookup area HA is preferably inserted in the middle portion of the memory area MA. In this manner, the semiconductor memory device 1 can suppress a delay in the voltage change that tends to occur at the end portion of the word line WL due to the wiring resistance of the word line WL.

According to the embodiment, the word lines WL0 to WL7 are described as being arranged in a row as a staircase in the hookup areas HA1 and HA2. The structure, however, is not limited thereto. The hookup areas HA1 and HA2 may include two rows of staircases in the Y direction. The stacked word lines WL may be designed to have any number of steps formed in the X direction and Y direction.

Throughout the specification, the position of each slit SLT may be identified based on the position of the contact LI. If the slit SLT is formed of an insulator, the position of the slit SLT may be identified by a seam or void in the slit SLT, or by the material remaining in the slit SLT after the replacement process.

The "area" discussed in the specification may be considered to be a component included in the semiconductor substrate. For instance, when the semiconductor substrate includes a memory area MA and hookup areas HA1 and HA2, these memory area MA and hookup areas HA1 and HA2 are associated with different areas above the semiconductor substrate (e.g., P-type well region 20). The "height" may be a distance in the Z direction between the measurement target component and the semiconductor substrate. Any component may be adopted as the reference of the "height" in place of the semiconductor substrate.

The term "coupling" throughout the specification refers to electrical coupling, and therefore it may include coupling by way of other elements. The expression "electrically coupled" may indicate coupling components via an interposed insulator if the components are able to operate in the same manner as when being electrically coupled. A "pillar" refers to a structure provided in a hole formed in the process of producing a semiconductor memory device 1. The "same layer structure" means that at least the layers being stacked in the same order. When "the same layer structure" is included, the layer structure, for example in a slit SLT, is formed in the same manufacturing method. The portion in which a seam is created in the slit SLT and the portion in which a void is created therefore can be considered to have the same layer structures. In the present specification, A "slit" may also be referred to as a "member", a "component", etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
  a substrate including a plurality of block areas, each of the plurality of block areas being provided to extend in a first direction, and the plurality of block areas being arranged in a second direction that intersects the first direction;
  a plurality of members, each of the plurality of members being provided to extend in the first direction, and being respectively disposed at a boundary portion between the plurality of block areas;
  a plurality of conductive layers partitioned by the plurality of members, the plurality of conductive layers being arranged in a third direction that intersects the first direction and the second direction, and being disposed separately from each other; and
  a plurality of pillars disposed in each of the plurality of block areas, each of the plurality of pillars being provided to penetrate the plurality of conductive layers, a portion at which one of the plurality of pillars and one of the plurality of conductive layers intersect functioning as a memory cell,
  wherein at least one member of the plurality of members includes a plurality of first portions and a second portion, the plurality of first portions being arranged in the first direction, and the second portion being disposed between any two adjacent ones of the plurality of first portions,
  when either one of one of the plurality of first portions and the second portion of the one member is referred to as a third portion, and the other one of the one of the plurality of first portions and the second portion of the one member is referred to as a fourth portion, the third portion has a width in the second direction greater than a width of the fourth portion in the second direction, and the third portion has a length in the first direction greater than the width of the fourth portion in the second direction,
the plurality of first portions of the member have a same layer structure as the second portion,
the fourth portion of the member includes a seam,
the third portion of the member includes a void,
the one member includes a contact and an insulating film, the contact including a portion provided to extend in the first direction, and the insulating film being provided between the contact and the plurality of conductive layers, and
the contact includes the seam.

2. The device of claim 1, wherein
the one member has the plurality of second portions arranged at intervals in the first direction, and each of the plurality of first portions is disposed between any two adjacent ones of the plurality of second portions.

3. The device of claim 1, wherein
the one member includes a bottom portion, a middle portion, and an upper portion arranged in the third direction from a side of the substrate, the middle portion of the member having a width greater than a width of the bottom portion and greater than a width of the upper portion in the second direction, and
the middle portion of the fourth portion of the one member includes the seam, and the middle portion of the third portion of the member includes the void.

4. The device of claim 1, further comprising:
a plurality of bit lines each having a portion provided to extend in the second direction, each of the plurality of bit lines being coupled to at least one of the plurality of pillars in each of the plurality of block areas; and
a shunt line having a portion provided to extend in the second direction, the plurality of members including contacts respectively and the shunt line being coupled to at least one of the contacts included in the plurality of members,
wherein the substrate includes a memory area that includes the plurality of pillars, the memory area includes a shunt area that includes the shunt line and does not include the plurality of bit lines, and the shunt area includes the third portion of the one member.

5. The device of claim 1, further comprising:
a plurality of bit lines each having a portion provided to extend in the second direction, and each of the plurality of bit lines being coupled to at least one of the plurality of pillars in each of the plurality of block areas; and
a shunt line having a portion provided to extend in the second direction, the plurality of members including contacts respectively and the shunt line being coupled to at least one of the contacts included in the plurality of members,
wherein the substrate includes a memory area that includes the plurality of pillars, the memory area includes a shunt area that includes the shunt line and does not include the plurality of bit lines, and the shunt area includes the fourth portion of the one member.

6. The device of claim 1, wherein
the plurality of first portions of the member are disposed adjacent to the plurality of pillars in the second direction.

7. The device of claim 1, wherein
the second portion of the member is disposed adjacent to the plurality of pillars in the second direction.

8. A semiconductor memory device comprising:
a substrate including a plurality of block areas, each of the plurality of block areas being provided to extend in a first direction, and the plurality of block areas being arranged in a second direction that intersects the first direction;
a plurality of members, each of the plurality of members being provided to extend in the first direction, and being respectively disposed at a boundary portion between the plurality of block areas;
a plurality of conductive layers partitioned by the plurality of members, the plurality of conductive layers being arranged in a third direction that intersects the first direction and the second direction, and being disposed separately from each other; and
a plurality of pillars disposed in each of the plurality of block areas, each of the plurality of pillars being provided to penetrate the plurality of conductive layers,
a portion at which one of the plurality of pillars and one of the plurality of conductive layers intersect functioning as a memory cell,
wherein at least one member of the plurality of members includes a first portion and a second portion arranged in the first direction,
when either one of one of the first portion and the second portion of the one member is referred to as a third portion, and the other one of the one of the first portion and the second portion of the one member is referred to as a fourth portion, the third portion has a width in the second direction greater than a width of the fourth portion in the second direction,
the fourth portion of the one member includes a seam, and the third portion of the member includes a void,
the one member includes a contact and an insulating film, the contact including a portion provided to extend in the first direction, and the insulating film being provided between the contact and the plurality of conductive layers, and
the contact includes the seam.

9. The device of claim 8, wherein
the one member includes a bottom portion, a middle portion, and an upper portion provided in the third direction from a side of the substrate, and the middle portion of the one member has a width greater than a width of the bottom portion and greater than a width of the upper portion in the second direction.

10. The device of claim 8, wherein
the one member includes a plurality of first portions and the second portion; and
the one member has the plurality of first portions arranged in the first direction, and the second portion is disposed between any two adjacent ones of the plurality of first portions.

11. The device of claim 8, wherein
the third portion has a length in the first direction greater than the width of the fourth portion in the second direction.

12. The device of claim 8, wherein
the one member further includes seams arranged at intervals in the first direction.

13. The device of claim 12, wherein
the one member includes a void between any two adjacent ones of the seams.

14. The device of claim 8, further comprising:
a plurality of bit lines each having a portion provided to extend in the second direction, each of the plurality of bit lines being coupled to at least one of the plurality of pillars in each of the plurality of block areas; and a shunt line having a portion provided to extend in the second direction, the plurality of members including contacts respectively and the shunt line being coupled to at least one of the contacts included in the plurality of members, wherein the substrate includes a memory area that includes the plurality of pillars, the memory area includes a shunt area that includes the shunt line and does not include the plurality of bit lines, and the shunt area includes the third portion of the member.

15. The device of claim 8, further comprising:

a plurality of bit lines each having a portion provided to extend in the second direction, each of the plurality of bit lines being coupled to at least one of the plurality of pillars in each of the plurality of block areas; and a shunt line having a portion provided to extend in the second direction, the plurality of members including contacts respectively and the shunt line being coupled to at least one of the contacts included in the plurality of members, wherein the substrate includes a memory area that includes the plurality of pillars, the memory area includes a shunt area that includes the shunt line and does not include the plurality of bit lines, and the shunt area includes the fourth portion of the member.

\* \* \* \* \*